US012666573B2

(12) United States Patent
Jia et al.

(10) Patent No.: US 12,666,573 B2
(45) Date of Patent: Jun. 23, 2026

(54) HEAT DISSIPATION APPARATUS AND ELECTRONIC DEVICE

(71) Applicant: Huawei Technologies Co., Ltd., Shenzhen (CN)

(72) Inventors: Lirui Jia, Dongguan (CN); Chaorong Liu, Dongguan (CN); Peng Jin, Dongguan (CN); Tao Yan, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 451 days.

(21) Appl. No.: 18/184,479

(22) Filed: Mar. 15, 2023

(65) Prior Publication Data

US 2023/0240048 A1 Jul. 27, 2023

Related U.S. Application Data

(63) Continuation of application No. PCT/CN2021/118028, filed on Sep. 13, 2021.

(30) Foreign Application Priority Data

Sep. 16, 2020 (CN) .......................... 202010977084.X

(51) Int. Cl.
*H05K 7/20* (2006.01)

(52) U.S. Cl.
CPC .................................. *H05K 7/2039* (2013.01)

(58) Field of Classification Search
CPC ... G02B 6/4269; H01L 23/3672; H01L 23/40; H01L 21/4882; H01L 23/4006;
(Continued)

(56) References Cited

U.S. PATENT DOCUMENTS 7,133,285 B2 * 11/2006 Nishimura ........... H05K 5/0265
165/185
7,518,870 B2 4/2009 Choi et al.
(Continued)

FOREIGN PATENT DOCUMENTS

CN 201038390 Y 3/2008
CN 203353033 U 12/2013
(Continued)

*Primary Examiner* — Jayprakash N Gandhi
*Assistant Examiner* — Matthew Sinclair Muir
(74) *Attorney, Agent, or Firm* — WOMBLE BOND DICKINSON (US) LLP

(57) ABSTRACT

A heat dissipation apparatus is provided. The apparatus includes: a bracket assembly including an accommodation portion used for accommodating a heat source component, a first opening, and a second opening; a heat sink. A heat conducting protrusion is disposed on a first surface of the heat sink, and the heat conducting protrusion extends into the accommodation portion through the second opening; and guide grooves are respectively provided in two side surfaces of the heat sink, and an extension direction of the guide grooves is inclined toward the first surface in an insertion direction of the heat source component; and fastening assemblies, each including a connecting member and a pressing member, where the pressing members are disposed on two sides of the bracket assembly, one end of the connecting member is slidably assembled in a guide groove located on a same side, and the other end abuts against a pressing member.

20 Claims, 4 Drawing Sheets

(58) Field of Classification Search
      CPC .............. H05K 7/2039; H05K 7/2049; H05K
                                                7/20409; H05K 7/20436
      See application file for complete search history.

(56)                     References Cited

U.S. PATENT DOCUMENTS

| | | | | |
|---|---|---|---|---|
| 7,667,972 B2 * | 2/2010 | Chen | .................... | H05K 7/2049 |
| | | | | 165/185 |
| 8,057,110 B2 | 11/2011 | Harris | | |
| 8,081,470 B2 * | 12/2011 | Oki | ...................... | G02B 6/4201 |
| | | | | 165/185 |
| 10,197,754 B2 | 2/2019 | Moore et al. | | |
| 10,222,844 B1 * | 3/2019 | Reddy | ........................ | G06F 1/20 |
| 10,306,806 B2 * | 5/2019 | Hall, III | ............... | G02B 6/4261 |
| 10,986,757 B2 * | 4/2021 | Saturley | ............... | H05K 5/0069 |
| 2005/0162834 A1 | 7/2005 | Nishimura | | |
| 2005/0215098 A1 | 9/2005 | Muramatsu et al. | | |
| 2008/0278914 A1 | 11/2008 | Chen et al. | | |
| 2010/0284152 A1 | 11/2010 | Harris | | |
| 2014/0098497 A1 | 4/2014 | Henry et al. | | |
| 2021/0307204 A1 * | 9/2021 | Lu | ...................... | H05K 7/20418 |

FOREIGN PATENT DOCUMENTS

| | | | |
|---|---|---|---|
| CN | 104125751 A | 10/2014 |
| CN | 104979678 A | 10/2015 |
| CN | 106932865 A | 7/2017 |
| CN | 114269106 B | 11/2024 |
| JP | 2015088575 A | 5/2015 |
| JP | 2020035800 A | 3/2020 |
| WO | 2014075429 A1 | 5/2014 |

* cited by examiner

HEAT DISSIPATION APPARATUS AND ELECTRONIC DEVICE

CROSS-REFERENCE TO RELATED APPLICATIONS

This application is a continuation of International Application No. PCT/CN2021/118028, filed on Sep. 13, 2021, which claims priority to Chinese Patent Application No. 202010977084.X, filed on Sep. 16, 2020. The disclosures of the aforementioned applications are hereby incorporated by reference in their entireties.

TECHNICAL FIELD

This application relates to the field of heat dissipation technologies, and in particular, to a heat dissipation apparatus and an electronic device.

BACKGROUND

A variety of electronic components are disposed in electronic devices and communications devices. Some electronic components generate heat during operation, and the heat needs to be conducted out to implement heat dissipation for these electronic components, to ensure normal operation of the electronic components. During the use of an electronic component, some swappable component structures are often used. For example, an optical module component needs to be inserted and removed in many communications devices, and heat dissipation needs to be performed. In another example, some hard disks also need to be inserted in a server or removed from a server, and heat dissipation also needs to be performed.

A heat sink for a swappable heat source is used for a heat source that is swappable, and is an apparatus for conducting and releasing heat of a swappable heat source component. With the development of electronic technologies and the rapid improvement of informatization, power consumption of some swappable heat source components keeps increasing, and a requirement for heat dissipation effect or heat dissipation efficiency of these heat source components is increasingly high.

SUMMARY

An objective of this application is to provide a heat dissipation apparatus and an electronic device, so that thermal contact resistance of a heat sink and a heat source component can be reduced to some extent, heat transfer performance between the heat sink and the heat source component can be improved, heat dissipation of the heat source component can be more effective, it can be labor-saving to insert or remove the heat source component, thereby facilitating the insertion and removal of the heat source component, and the problems in the foregoing background can be overcome or the foregoing technical problems can be at least partially resolved.

According to a first aspect of this application, a heat dissipation apparatus is provided, used for dissipating heat for a heat source component. The heat dissipation apparatus includes:

a bracket assembly, where the bracket assembly includes an accommodation portion, a first opening, and a second opening, the accommodation portion is used for accommodating the heat source component, and the first opening is provided at an end of the accommodation portion and is used for inserting or removing the heat source component; and the second opening is provided above the accommodation portion; a heat sink, where a heat conducting protrusion is disposed on a first surface of the heat sink, the first surface is a surface of the heat sink opposite to the second opening, and the heat conducting protrusion extends into the accommodation portion through the second opening; and guide grooves are respectively provided in two side surfaces of the heat sink, and an extension direction of the guide grooves is inclined toward the first surface in an insertion direction of the heat source component; fastening assemblies, each including a connecting member and a pressing member, where the pressing members are disposed on two sides of the bracket assembly, one end of the connecting member is slidably assembled in a guide groove located on a same side, and the other end of the connecting member abuts against a pressing member located on a same side, where the bracket assembly mates with the fastening assemblies, so that in a process of inserting the heat source component into the accommodation portion, the heat source component pushes the heat sink to move in the insertion direction, one end of the connecting member slides toward the first opening in the guide groove, to drive the heat sink to move toward the surface of the heat source component, and the pressing members provide, by the connecting member, pressure for the heat conducting protrusion to be joined to the surface of the heat source component.

The heat dissipation apparatus is applicable to heat dissipation of a swappable heat source component, and includes a bracket assembly, a heat sink, and fastening assemblies. The bracket assembly is provided with an accommodation portion, a first opening, and a second opening. The heat source component can be inserted into the accommodation portion or removed from the accommodation portion through the first opening. The heat sink is provided with a heat conducting protrusion. The heat conducting protrusion extends into the accommodation portion through the second opening and is in conduction with the heat source component. When the heat conducting protrusion is joined to a surface of the heat source component, heat of the heat source component can be conducted out. In particular, in the heat dissipation apparatus, guide grooves are respectively provided in two side surfaces of the heat sink, and an extension direction of the guide grooves is inclined downward in the insertion direction of the heat source component. In this way, the guide grooves can be provided to guide movement of the heat sink, so that in a process of insertion or removal, the heat sink can move obliquely under the guidance of the guide grooves, to reduce a sliding friction force in a movement process, thereby making the insertion and removal more labor-saving and convenient. In addition, to make the guide grooves play a guiding function, the heat dissipation apparatus is provided with the fastening assemblies, and one end of each connecting member is slidably assembled in a guide groove located on a same side, so that the heat sink can move downward obliquely in the process of insertion or removal, thereby reducing a sliding friction force in the movement process. Moreover, as the heat sink moves downward obliquely, the heat sink gradually approaches the surface of the heat source component, to make the heat conducting protrusion of the heat sink abut against or be tightly joined to or be in close contact with the surface of the heat source component, so that thermal contact resistance between the heat sink and the heat source component can be reduced, thereby improving a heat dissipation capability. In addition, in the process, through a mating connection between the other end of the connecting member and the pressing member, a force of the pressing member can be transferred to the heat sink through the connecting member, so that the heat conducting protrusion of the heat sink is tightly joined to the surface of the heat source component, thereby providing stable or controllable pressure for the heat conducting protrusion of the heat sink to be joined to the surface of the heat source component, or the pressing member may be used to keep the connecting member from being separated from the bracket assembly in the movement process.

Therefore, in the heat dissipation apparatus, through the mating arrangement of the bracket assembly, the guide grooves in the heat sink, the connecting members, the pressing members, and the like, the heat conducting protrusion of the heat sink can be joined to the surface of the heat source component, so that thermal contact resistance of the heat sink and the heat source component is effectively reduced, heat transfer performance between the heat sink and the heat source component is improved, and heat dissipation of the heat source component is more effective. In addition, no sliding friction movement occurs on a heat conducting joining surface between the heat sink and the heat source component in the process of inserting or removing the heat source component, the insertion and removal are smooth, labor-saving, and convenient, and contact pressure is stable and controllable.

It should be noted that, when the other end of the connecting member is in contact with the pressing member located on the same side, at least a part of the pressing member may be pressed above the other end of the connecting member, or at least a part of the pressing member may be connected below the other end of the connecting member.

It should be further noted that, an extension length of the second opening needs to be at least greater than or equal to a sliding distance of an insertion or removal movement of the heat source component. The sliding distance is a distance that the heat source component drives the heat sink to move synchronously in the process of the insertion or removal movement.

In one embodiment, one or more guide grooves may be provided in each side surface of the heat sink. Further, a plurality of guide grooves may be provided in each side surface of the heat sink. For example, two, three, four, or more guide grooves may be provided in each side surface of the heat sink.

It should be understood that the heat sink includes two side surfaces. One or more guide grooves may be provided in one side surface of the heat sink, and one or more guide grooves may be provided in the other side surface of the heat sink. A specific quantity of guide grooves is not particularly limited, provided that a total quantity of guide grooves is kept an even number. In addition, when a plurality of guide grooves are provided in each side surface of the heat sink, an arrangement manner of the guide grooves or a distance between two adjacent guide grooves in one side surface of the heat sink corresponds to an arrangement manner of the guide grooves or a distance between two adjacent guide grooves in the other side surface of the heat sink.

Correspondingly, a quantity of fastening assemblies corresponds to the quantity of guide grooves. That is, a quantity of connecting members corresponds to the quantity of guide grooves, and a quantity of pressing members corresponds to the quantity of connecting members.

In one embodiment, two guide grooves may be provided in each side surface of the heat sink, and the two guide grooves are respectively located at two ends of the side surface. Therefore, the structure is simple, the arrangement is convenient, the stability of movement is improved, and the structure is firmer and more reliable.

Correspondingly, two fastening assemblies are disposed on one side surface of the bracket assembly, and the two fastening assemblies are arranged corresponding to two guide grooves located on a same side. Two fastening assemblies are arranged on the other side surface of the bracket assembly, and the two fastening assemblies are arranged corresponding to two guide grooves located on a same side.

In one embodiment, a movement driving portion is further disposed on the first surface of the heat sink, and the movement driving portion is located on a side of the heat conducting protrusion; and in the process of inserting the heat source component into the accommodation portion, the heat source component gradually moves to be connected to the movement driving portion, to push the heat sink to move in the insertion direction.

In the process of inserting the heat source component into the accommodation portion, before the heat source component is connected to the movement driving portion, only the heat source component may move and the heat sink does not move. When the heat source component moves to be connected to the movement driving portion on the heat sink, through the arrangement of the movement driving portion, the heat source component can push the heat sink to move toward the surface of the heat source component. In this way, movement of the heat sink and the heat source component can be implemented, and the heat conducting protrusion of the heat sink is further joined to the surface of the heat source component, thereby improving a heat dissipation capability.

A specific implementation of the movement driving portion may have a plurality of structural forms. For example, the movement driving portion may be a boss, may be a hook mating structure, or may be another structure.

In one embodiment, the movement driving portion is a boss, and a distance between the boss and the first surface of the heat sink may be greater than a distance between the heat conducting protrusion and the first surface of the heat sink; and a contact portion is disposed at a side end of the heat source component in the insertion direction of the heat source component, and the contact portion abuts against the boss.

The heat conducting protrusion and the boss are disposed on the first surface (for example, a bottom surface of the heat sink) of the heat sink. Relative to the first opening, compared with the boss, the heat conducting protrusion may be closer to the first opening. A distance between an outer surface of the heat conducting protrusion and the first surface of the heat sink is different from a distance between an outer surface of the boss and the first surface of the heat sink. Relatively speaking, the distance between the outer surface of the boss and the first surface of the heat sink is large, so that the contact portion can abut against the boss conveniently, and the heat sink can be pushed to move through the abutting between the contact portion with the boss.

In one embodiment, the contact portion is an end face located at a side end of the heat source component. Through a mating contact mode of the boss and the contact portion, the structure is simple, the processing and manufacturing are convenient, and the cost is reduced.

In another possible implementation, the movement driving portion is a hook mating structure, and a hook is disposed at a side end of the heat source component in the insertion direction of the heat source component. In the process of inserting the heat source component into the accommodation portion, the hook of the heat source component may be connected to the hook mating structure of the heat sink, so that the heat source component pushes the heat sink to move toward the surface of the heat source component.

In one embodiment, the connecting member is fastened to the pressing member.

In another embodiment, the connecting member and the pressing member are integrally formed.

In the foregoing fastening assemblies, the connecting member and the pressing member may be of an integrated structure, and the two may be integrally formed. In this way, the structure is stable and reliable, the overall strength is improved, and installation and disassembly are convenient. Alternatively, the connecting member and the pressing member may be of a split structure, and the two may be connected together. In this way, the connecting member and the pressing member may be manufactured separately, which helps reduce manufacturing difficulty.

In one embodiment, the bracket assembly includes a support frame and a cage, the support frame is located outside the cage, and the accommodation portion, the first opening, and the second opening are all disposed in the cage; and the support frame includes two opposite side edges, the heat sink is located between the two side edges, and the pressing members are installed on the two side edges.

In the bracket assembly, the support frame is arranged on an outer side of the cage, and the support frame can block or surround at least two or more outer side surfaces of the cage. The support frame includes two opposite side edges. An extension direction of the two side edges corresponds to an extension direction of the two side surfaces of the heat sink. The heat sink is located between the two side edges, and the heat conducting protrusion of the heat sink can extend into the accommodation portion through the second opening of the cage. The pressing members in the fastening assemblies may be disposed on two sides, so that it is convenient to insert or remove the heat source component into or from the accommodation portion without affecting the movement of the heat source component or the heat sink, it is convenient to arrange the pressing member and the connecting member, the structure is compact, and the design is appropriate.

In one embodiment, the pressing member may be installed on an outer side of each of the two side edges, a top side, or the like of the support frame. The pressing member is at least partially pressed above the connecting member, or the pressing member may be disposed below the connecting member.

In one embodiment, the support frame is fastened to the cage.

In another embodiment, the support frame and the cage are integrally formed.

In the bracket assembly, the support frame and the cage may be of an integrated structure, and the two may be integrally formed. In this way, the structure is stable and reliable, the overall strength is improved, and the installation and disassembly are convenient. Alternatively, the support frame and the cage may be of a split structure, and the two may be fastened together. In this way, the support frame and the cage may be manufactured separately, which helps reduce manufacturing difficulty.

In one embodiment, mating portions are respectively disposed on the two side edges of the support frame, the connecting member includes a connecting portion connected to each mating portion, and the connecting portion is located between two ends of the connecting member; and the connecting member mates with the mating portion to limit the movement direction of the connecting member.

The connecting member may include three parts. One end of the connecting member is used for being connected to the guide groove in a sliding manner, the other end of the connecting member is used for being connected to the pressing member, and a connecting portion used for connecting to the support frame is disposed between the two ends of the connecting member. In one embodiment, one end of the connecting member may be a first connecting portion, the other end of the connecting member may be a third connecting portion, and a connecting portion between the two ends of the connecting member may be a second connecting portion.

The mating portion is arranged on a side edge of the support frame, the second connecting portion is arranged between the two ends of the connecting member, and the second connecting portion is in a mating connection to the mating portion, which can be used to limit the movement of the connecting member only in a normal direction of a side in which the second opening of the cage is located and a separation direction of the support frame, to keep the connecting member from moving in the insertion direction or the removal direction during the insertion or removal of the heat source component into or from the accommodation portion.

Specifically, a specific structure or a mating manner of the second connecting portion and the mating portion may be of various types, and a common mechanism that can move linearly may be used, for example, a mechanism that can only move up and down linearly and is limited from moving left and right is used. For example, the second connecting portion and the mating portion may be in a form of a concave-convex mating structure, or may be in a form of a mating structure of a guide pin and a guide sleeve, or may be in a form of a mating structure of a slider and a guide rail, or the like.

In one embodiment, the connecting portion (that is, the second connecting portion) is of a block structure, and a concave groove and a limiting protrusion that mate with each other are respectively disposed on a surface of the block structure and a surface of the mating portion, where the surfaces are in contact. The block structure may be provided with the concave groove, and the mating portion is provided with the limiting protrusion, or the mating portion may be provided with the concave groove, and the block structure is provided with the limiting protrusion. Therefore, a movement direction of the connecting member can be limited through a concave-convex mating connection between the concave groove and the limiting protrusion.

In the process of inserting or removing the heat source component into or from the accommodation portion, through a concave-convex mating connection manner of the second connecting portion and the mating portion, the connecting member can only move in the normal direction of the side in which the second opening of the cage is located and the separation direction of the support frame, and the connecting member can be kept from moving in the insertion direction or the removal direction. In this way, the heat sink moves toward the heat source component, and further, the heat conducting protrusion of the heat sink is closely joined to the surface of the heat source component, thereby improving heat dissipation effect. Moreover, the structure is simple, the processing and manufacturing are convenient, and the cost is low.

In another embodiment, the guide pin and the guide sleeve that mate with each other are respectively disposed on a surface of the connecting portion (that is, the second connecting portion) and a surface of the mating portion, where the surfaces are in contact. The connecting portion may be provided with the guide pin, and the mating portion is provided with the guide sleeve, or the connecting portion may be provided with the guide sleeve, and the mating portion is provided with the guide pin. Therefore, the movement direction of the connecting member can be limited by the mating connection between the guide pin and the guide sleeve.

In the process of inserting or removing the heat source component into or from the accommodation portion, in the mating connection manner of the guide pin and the guide sleeve, the connecting member can only move in the normal direction of the side in which the second opening of the cage is located and the separation direction of the support frame, and the connecting member can be kept from moving in the insertion direction or the removal direction. In this way, the heat sink moves toward the heat source component, and further, the heat conducting protrusion of the heat sink is closely joined to the surface of the heat source component, thereby improving heat dissipation effect.

In one embodiment, the pressing member is an elastic member. The material of the pressing member is an elastic material. In this way, in the process of inserting or removing the heat source component into or from the accommodation portion, the pressing member can provide an elastic force, facilitate insertion and removal, and can promote tight joining between the heat conducting protrusion of the heat sink and the surface of the heat source component. This is beneficial to providing stable and controllable pressure for joining of the heat conducting protrusion of the heat sink to the surface of the heat source component, reducing thermal contact resistance, and is more beneficial to conducting out heat generated by the heat source component.

In one embodiment, the elastic member includes a spring or a spring sheet. The spring includes a cantilever spring or a two-end fixed spring. The spring sheet includes a cantilever spring sheet or a two-end fixed spring sheet.

Specifically, in one embodiment, the elastic member may be a cantilever spring sheet or a spring. One end of the elastic member is fastened to an outer side wall of the bracket assembly, the other end of the elastic member is a free end, and the free end is pressed above the connecting member.

In another embodiment, the elastic member may be a two-end spring sheet or spring. Two ends of the elastic member are respectively fastened to an outer side wall of the bracket assembly, and a part of the pressing member between the two ends of the elastic member is pressed above the connecting member.

Alternatively, in another embodiment, the elastic member may be located below the connecting member. One end of the elastic member is connected to the bracket assembly, and the other end of the elastic member is connected to a lower end of the connecting member, and the connecting member may tend to move downward.

In one embodiment, the heat dissipation apparatus further includes a restoring elastic element, and the restoring elastic element is located between the heat sink and the bracket assembly. In the process of removing the heat source component from the accommodation portion, the restoring elastic component provides a restoring force, so that the heat conducting protrusion is separated from the heat source component.

In one embodiment, one end of the restoring elastic element is connected to an inner side surface of the bracket assembly, and the other end of the restoring elastic element is connected to an outer side end of the heat sink.

In one embodiment, the restoring elastic element includes a spring or a spring sheet. The spring includes a cantilever spring or a two-end fixed spring. The spring sheet includes a cantilever spring sheet or a two-end fixed spring sheet.

In one embodiment, the heat dissipation apparatus further includes a heat conducting medium, and the heat conducting medium is located between the heat conducting protrusion and the heat source component.

In one embodiment, the heat conducting medium is connected to the heat conducting protrusion, or the heat conducting medium is connected to an upper surface of the heat source component.

In one embodiment, the heat source component described above may be any one of an optical module, a chip, a circuit module, or a board module.

In one embodiment, the foregoing heat source component is an optical module.

Based on the first aspect and various embodiments of the first aspect, a second aspect of this application provides a heat dissipation apparatus. The heat dissipation apparatus includes: a bracket assembly, where the bracket assembly includes an accommodation portion, a first opening, and a second opening, the accommodation portion is used for accommodating a heat source component, and the first opening is provided at an end of the accommodation portion and is used for inserting or removing the heat source component; and the second opening is provided above the accommodation portion; a heat sink, where a heat conducting protrusion is disposed on a first surface of the heat sink, and the heat conducting protrusion extends into the accommodation portion through the second opening; the first surface is further provided with a movement driving portion, and the movement driving portion is located on a side of the heat conducting protrusion; and in a process of inserting the heat source component into the accommodation portion, after the heat source component is in contact with the movement driving portion, the heat source component pushes the heat sink to move in an insertion direction; and fastening assemblies, where the fastening assemblies mate with the bracket assembly, so that in the process of inserting the heat source component into the accommodation portion, after the heat source component is in contact with the movement driving portion, the heat sink moves toward a surface of the heat source component; and the fastening assemblies provide pressure for the heat conducting protrusion to be joined to the surface of the heat source component.

In one embodiment, the movement driving portion is a boss, and a distance between the boss and the first surface of the heat sink is greater than a distance between the heat conducting protrusion and the first surface of the heat sink; and a contact portion is disposed at a side end of the heat source component in the insertion direction of the heat source component, and the contact portion abuts against the boss.

In one embodiment, guide grooves are respectively provided in two side surfaces of the heat sink, and an extension direction of the guide grooves is inclined toward the first surface in an insertion direction of the heat source component; and fastening assemblies, each including a connecting member and a pressing member, where the pressing members are disposed on two sides of the bracket assembly, one end of the connecting member is slidably assembled in a guide groove located on a same side, and the other end of the connecting member abuts against a pressing member located on a same side; and the fastening assemblies mate with the bracket assembly, so that in the process of inserting the heat source component into the accommodation portion, after the heat source component is in contact with the movement driving portion, one end of the connecting member slides toward the first opening in the guide groove, to drive the heat sink to move toward the surface of the heat source component, and the pressing members provide, by the connecting member, pressure for the heat conducting protrusion to be joined to the surface of the heat source component.

For another embodiment of the second aspect of this application, refer to the first aspect and the possible implementations of the first aspect, and effects obtained in the first aspect and the possible implementations of the first aspect are provided.

According to a third aspect of this application, an electronic device is provided, including a heat source component, where the electronic device further includes the foregoing heat dissipation apparatus.

In one embodiment, the heat source component includes one of an optical module, a chip, a circuit module, or a board module.

The electronic device provided in this application includes the foregoing heat dissipation apparatus, and therefore has at least the same advantage as the heat dissipation apparatus. Details are not described herein again.

Other aspects and advantages of the heat dissipation apparatus and the electronic device in this application are partially described and shown in subsequent descriptions, or are explained through implementation of embodiments of this application.

It should be understood that the foregoing general description and the following detailed description are merely examples, and are not intended to limit this application.

BRIEF DESCRIPTION OF DRAWINGS

To describe the technical solutions in embodiments of this application more clearly, the following briefly describes the accompanying drawings for describing embodiments of this application. It is clear that a person of ordinary skill in the art may still derive other drawings from these accompanying drawings without creative efforts.

REFERENCE NUMERALS

Figure 1:
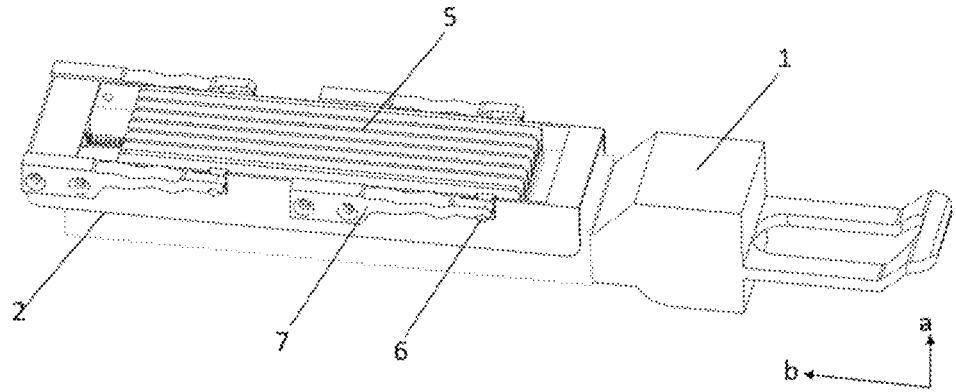
FIG. 1 is a schematic diagram of a structure of a heat dissipation apparatus according to an example implementation of this application.

1—heat source component; 101—upper surface; 102—contact portion;

2—bracket assembly;

3—cage; 301—accommodation portion; 302—second opening; 303—top surface; 304—first opening;

4—support frame; 401—mating portion; 4011—limiting protrusion; 402—heat dissipation window;

5—heat sink; 501—guide groove; 502—heat conducting protrusion; 503—movement driving portion; 504—return spring contact portion;

6—connecting member; 601—first connecting portion; 602—second connecting portion; 6021—concave groove; 603—third connecting portion;

7—pressing member;

8—restoring elastic element;

9—heat conducting medium;

a-thickness direction; and b-length direction.

The accompanying drawings are incorporated in this specification and constitute a part of this specification, show embodiments conforming to this application, and are used together with this specification to explain the principle of this application.

DESCRIPTION OF EMBODIMENTS

To better understand the technical solutions of this application, the following describes embodiments of this application in detail with reference to the accompanying drawings. It should be clear that the described embodiments are merely some rather than all of embodiments of this application. All other embodiments obtained by a person of ordinary skill in the art based on embodiments of this application without creative efforts shall fall within the protection scope of this application.

In various electronic devices such as IT devices and communications devices, more attention is paid to heat dissipation of plug-in heat source components. There are various types of existing plug-in heat source components, including optical modules, chips, circuit modules, board modules, and the like. However, heat dissipation of these plug-in heat source components by a conventional heat dissipation apparatus still has problems of large thermal resistance, poor heat dissipation effect, or inconvenient insertion and removal, and cannot satisfy requirements. Because problems in heat dissipation of these heat source components are the same or similar, for ease of description, the following mainly uses an optical module as an example to describe in detail the problem of heat dissipation of an existing heat source component. It should be understood that other related or similar heat source components that require heat dissipation also have the same or similar problems.

Currently, in a network communication service, an optical module is an integrated module that performs conversion between an optical signal and an electrical signal, plays an important role in an optical fiber communication process, and is widely used. An optical module generates a large amount of heat during optical fiber communication. To ensure normal operation of the optical module, the heat generated by the optical module needs to be conducted out and dissipated in time. With development of communications technologies, a communication speed is increased, a service port density is increased, an optical module also continuously increases a communication rate and occupies less space, power consumption of the optical module is continuously increased, and heat generated by the optical module is increased. Therefore, an optical module has an increasingly high requirement on heat dissipation, and it is very important to resolve a heat dissipation problem of a high-power optical module in a small space.

In the prior art, heat dissipation of a high-power swappable optical module is mostly performed by adding a heat sink to a hole in an optical cage, and the heat sink and a metal housing of the optical module are joined and pressed by a fastener. Joining is not tight at a joining position (a dry contact position) between the heat sink and the optical module because outer surfaces of the heat sink and the optical module have flatness tolerance and manufacturing roughness. Microscopically, the contact is local point contact between contacting metal, and gaps exist in a contact surface. A large amount of air exists in the gaps, thermal resistance is large, thermal conductivity is poor, and a heat dissipation capability is weak. Such a dry contact mode becomes the bottleneck of heat dissipation of a current optical module. In addition, a phenomenon of unstable contact pressure or uncontrollable contact pressure still exists between an existing heat sink and an existing heat source component, and due to poor contact between the heat sink and the heat source component, heat dissipation performance is affected.

To alleviate this problem, in the prior art, a solution of installing a flexible cushioning heat conducting pad or bonding a film between mating surfaces of a heat sink and an optical module is used, to reduce thermal contact resistance and improve a heat dissipation capability. However, in this manner, the heat conducting pad is easily punctured or worn in a process of inserting or removing the optical module, and the heat conducting pad is easily wrinkled. In addition, the method of increasing surface hardness of the heat conducting pad cannot fundamentally resolve the problem of puncture, and it is difficult to find a flexible scratch-resistant material. Specifically, the existing solution of adding a heat conducting pad or bonding a film mainly has the following problems: (1) the flexible cushioning heat conducting pad is easily punctured or worn in the process of insertion or removal, and the heat conducting pad is easily wrinkled. It is difficult to find a flexible, metal puncture-resistant, wear-resistant thermally conductive materials. (2) Due to the small positive pressure of joining, a flexible medium has poor filling property and limited thermal conductivity. (3) The heat conducting pad has a large friction coefficient, and the friction resistance in the insertion and removal movement is large after the positive pressure is increased. The insertion and removal force of the optical module is large, and it is difficult to insert or remove the optical module.

In view of this, the technical solutions of embodiments of this application provide a heat dissipation apparatus and an electronic device including the heat dissipation apparatus, to reduce thermal contact resistance between a heat sink and a heat source component, improve heat transfer performance between the heat sink and the heat source component, and save labor during insertion and removal, making it convenient for a user to insert or remove the heat source component.

In a specific embodiment, the following further describes in detail the heat dissipation apparatus and the electronic device including the heat dissipation apparatus in this application by using specific embodiments and with reference to the accompanying drawings. It should be noted that a same reference numeral in embodiments of this application represents a same component part or a same part or component. For a same part or component in embodiments of this application, only one part or component may be used as an example to mark a reference numeral in the figure. It should be understood that, for another same part or component, reference numerals are also applicable.

[Electronic Device]

To facilitate understanding of the heat dissipation apparatus provided in embodiments of this application, the following first describes an application scenario of the heat dissipation apparatus. The heat dissipation apparatus may be applied to an electronic device. For example, the electronic device may include but is not limited to a mobile phone, a tablet computer, a notebook computer, an in-vehicle computer, a display device (such as a television), and the like. In addition, the electronic device in this application is not limited to the foregoing device, but may include a newly developed electronic device. A specific implementation form of the foregoing electronic device is not limited in embodiments of this application.

Figure 2:
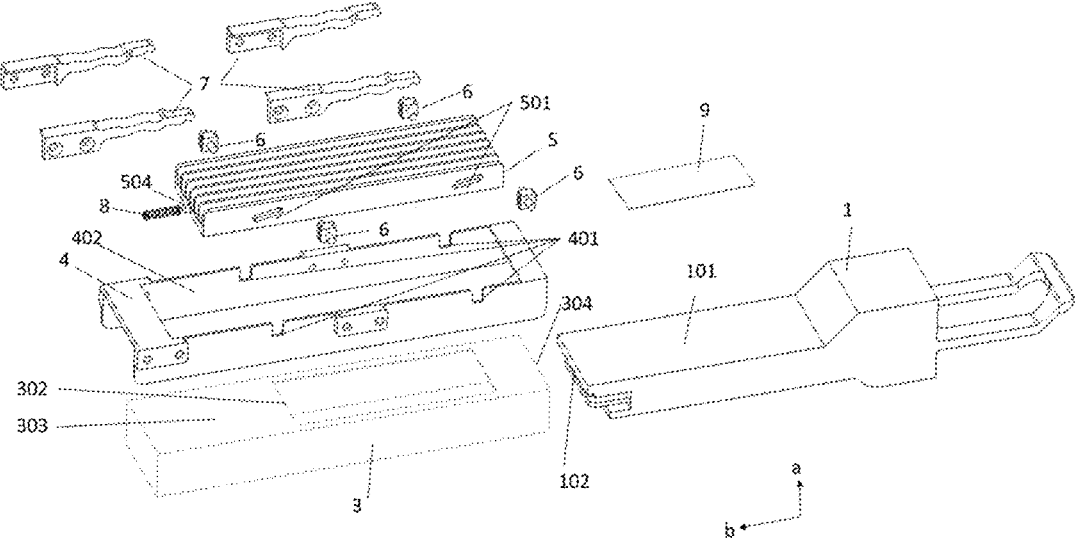
FIG. 2 is an exploded view of a heat dissipation apparatus according to an example implementation of this application.
Figure 3:
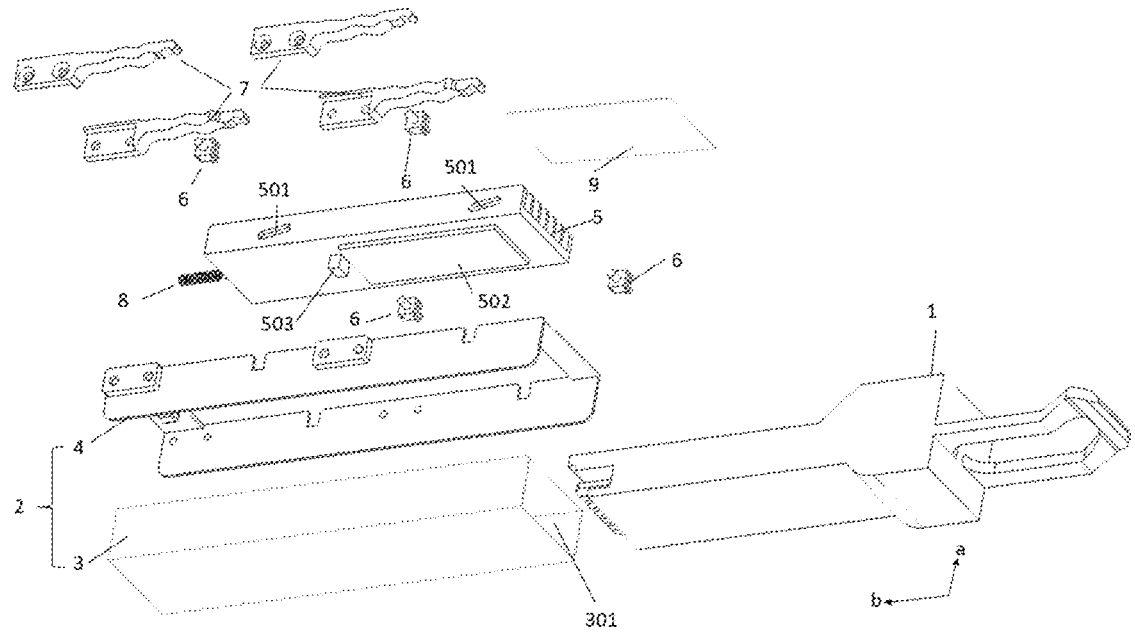
FIG. 3 is an exploded view of another perspective of a heat dissipation apparatus according to an example implementation of this application.

Referring to FIG. 1 to FIG. 3, this application provides an electronic device in some embodiments. The electronic device includes a heat dissipation apparatus and a heat source component 1. The heat dissipation apparatus may be connected to the heat source component 1, and is used for dissipating heat for the heat source component 1. In this way, heat of the heat source component 1 is conducted out in time, and normal operation of the heat source component 1 is ensured.

Specifically, the heat source component 1 may be a swappable or plug-in heat source component, the heat dissipation apparatus may be provided with an accommodation portion 301 used for accommodating the heat source component 1, and the heat source component 1 can be inserted into the accommodation portion 301 or removed from the accommodation portion 301. A specific structure of the heat dissipation apparatus is described in detail below with reference to FIG. 1 to FIG. 10, and is not described in detail herein.

In the electronic device, through the arrangement of a unique heat dissipation apparatus, heat dissipation effect of a heat source component can be improved, a heat dissipation requirement of the heat source component is satisfied, it is convenient and labor-saving to insert or remove the heat source component, and it is convenient for a user to insert or remove the heat source component.

It should be noted that specific positions of the heat dissipation apparatus and the heat source component in the electronic device, connections to another component, or the like are not limited in embodiments of this application. Therefore, details are not described herein again.

In addition, a person skilled in the art understands that, to provide a required function for a user, the electronic device may include several components disposed inside the device. This is not particularly limited in this application. A person skilled in the art may adjust a position, a specific structure, or the like of each component according to an actual requirement.

To enable the heat source component 1 in the electronic device to effectively dissipate heat, the heat source component 1 may be of various types, that is, the heat dissipation apparatus may adapt to different heat source components 1 for heat dissipation. The product has good universality and can satisfy heat dissipation optimization of different modules. In addition, the heat dissipation apparatus may further satisfy heat dissipation requirements of modules of different sizes without affecting the universality of a heat dissipation structure. Specifically, in some embodiments, the heat source component 1 may be an optical module, and the optical module may be a plug-in or swappable optical module. An existing or common plug-in optical module may be used for the optical module, which can alleviate a problem of large thermal resistance during heat dissipation, poor heat dissipation effect, or large insertion and removal resistance, and inconvenient insertion and removal existing in an existing optical module.

In some other embodiments, the heat source component 1 may be a chip (also referred to as a chip card), and the chip may be a plug-in or swappable chip. The chip may use an existing or common swappable chip card, which can alleviate problems such as large thermal resistance during heat dissipation and poor heat dissipation effect in an existing chip card.

In some other embodiments, the heat source component 1 may be a board module (also referred to as a board), and the board may be a plug-in or swappable board. An existing or common swappable board may be used for the board, which can alleviate problems such as large thermal resistance during heat dissipation, poor heat dissipation effect, or large insertion and removal resistance, and inconvenient insertion and removal existing in an existing board.

In some other embodiments, the heat source component 1 may be a circuit module, and the circuit module may be a plug-in or swappable circuit module. An existing or common swappable circuit module may be used for the circuit module, which can alleviate problems such as large thermal resistance during heat dissipation, poor heat dissipation effect, or large insertion and removal resistance, and inconvenient insertion and removal existing in an existing circuit module.

Certainly, in another embodiment, the heat source component may alternatively be another type of swappable electronic component, which is not described one by one herein again.

According to the heat dissipation apparatus provided in embodiments of this application, a specific structure of the heat source component 1 does not need to be improved. In other words, problems such as large thermal resistance during heat dissipation, poor heat dissipation effect, or large insertion and removal resistance, and inconvenient insertion and removal in some existing plug-in heat source components can be alleviated. In addition, the heat dissipation apparatus has good universality and strong flexibility, and is applicable to heat dissipation requirements of different modules without affecting universality of a heat dissipation structure.

It should be noted that, the heat source component 1 provided in embodiments of this application may be an optical module, but is not limited thereto. A structural principle of the heat dissipation apparatus may be implemented in any appropriately arranged heat source component of another type such as a chip or a circuit module. The following mainly describes the heat dissipation apparatus and the heat source component 1 in detail through an example in which the heat source component 1 is an optical module. A person skilled in the art will understand that the principle of the present disclosure may be applied to any appropriately arranged heat source component 1. In addition, for clarity and brevity, the description of well-known functions and structures may be omitted.

The following further describes the heat dissipation apparatus in the electronic device.

[Heat Dissipation Apparatus]

Referring to FIG. 1 to FIG. 3, an embodiment of this application provides a heat dissipation apparatus, used for dissipating heat for a heat source component 1, and is particularly applicable to heat dissipation of a swappable heat source component 1. The heat dissipation apparatus includes a bracket assembly 2, a heat sink 5, and fastening assemblies. Each fastening assembly includes a connecting member 6 and a pressing member 7.

The bracket assembly 2 is provided with an accommodation portion 301 for accommodating the heat source component 1, and the heat source component 1 can be inserted into the accommodation portion 301 or removed from the accommodation portion 301. The bracket assembly 2 is further provided with a first opening 304 and a second opening 302. The first opening is provided at one end of the accommodation portion 301, and is used for inserting or removing the heat source component 1. The second opening 302 is provided above the accommodation portion 301, and is used for enabling the heat source component 1 to be in conduction with the heat sink 5.

A heat conducting protrusion 502 is disposed on a first surface of the heat sink 5. The first surface is a surface of the heat sink 5 relative to the second opening 302. The heat conducting protrusion 502 may extend into the accommodation portion 301 through the second opening 302 of the bracket assembly 2 and is in conduction with the heat source component 1, to conduct out heat of the heat source component 1. The heat sink 5 has two opposite side surfaces, and guide grooves 501 are respectively provided in the two side surfaces of the heat sink 5, and an extension direction of the guide grooves 501 is inclined, for example, downward, toward the first surface in an insertion direction of the heat source component 1, to guide movement of the heat sink 5.

One end of the connecting member 6 is slidably assembled in a guide groove 501 located on a same side. One end of the connecting member 6 is connected to the guide groove 501 in a sliding fit manner, so that the movement of the heat sink 5 can be guided. The other end of the connecting member 6 abuts against a pressing member 7 located on a same side. The connecting member 6 is movable relative to the bracket assembly 2 in the extension direction of the guide grooves 501, that is, in a thickness direction relative to the bracket assembly 2.

The bracket assembly 2 mates with the fastening assemblies, so that in a process of inserting the heat source component 1 into the accommodation portion 301, the heat source component 1 pushes the heat sink 5 to move in the insertion direction, one end of the connecting member 6 slides toward the first opening 304 in the guide groove 501, to drive the heat sink 5 to move toward the surface of the heat source component 1, and the pressing members 7 provide pressure for the heat conducting protrusion 502 of the heat sink 5 to be joined to the surface of the heat source component 1 by the connecting member 6.

In addition, on the one hand, the pressing member 7 may provide pressure for the heat conducting protrusion 502 of the heat sink 5 to be joined to the surface of the heat source component 1, and on the other hand, may be further used for limiting the connecting member 6 from being separated from the bracket assembly 2. The pressing member 7 can apply a specific force to the connecting member 6, and the applied force may be transferred to the heat sink 5, so that the heat conducting protrusion 502 of the heat sink 5 tightly joined to the surface of the heat source component 1. The connecting member 6 may be kept from being separated from the bracket assembly 2 by the force of the pressing member 7 during the movement of the connecting member 6 relative to the bracket assembly 2, and further to cause the connecting member 6 to move toward the bracket assembly 2 or to generate a tendency to move.

When the other end of the connecting member 6 is in contact with the pressing member 7 located on the same side, at least a part of the pressing member 7 may be pressed above the other end of the connecting member 6, or at least a part of the pressing member 7 may be connected below the other end of the connecting member 6, which may be specifically selected and arranged according to the structures and types of the pressing member 7 and the connecting member 6.

An extension length of the second opening 302 needs to be at least greater than or equal to a sliding distance of an insertion or removal movement of the heat source component 1. The sliding distance is a distance that the heat source component 1 drives the heat sink 5 to move synchronously in the process of the insertion or removal movement. In this way, the second opening 302 can be kept from limiting the movement of the heat source component 1 and the heat sink 5.

In the process of inserting the heat source component 1 into the accommodation portion 301, the heat source component 1 pushes the heat sink 5 to move in the insertion direction. For example, the heat sink 5 can be driven to move in a length direction. Because the extension direction of the guide grooves 501 is inclined downward in the insertion direction of the heat source component 1, in a process in which one end of the connecting member 6 slides relative to the guide groove 501, the heat sink 5 can be driven to approach the surface of the heat source component 1. For example, the heat sink 5 can be driven to move toward the heat source component 1 in the thickness direction.

It should be noted that, in embodiments of this application, the thickness direction is a direction a in FIG. 1 to FIG. 3, and the length direction is a direction b in FIG. 1 to FIG. 3. Using FIG. 1 as an example, the thickness direction may be a height direction or a vertical direction, and the length direction may be an insertion or removal direction.

In the heat dissipation apparatus, the guide grooves 501 can be provided to guide movement of the heat sink 5, so that in the process of insertion or removal, the heat sink 5 can move obliquely under the guidance of the guide grooves 501, to reduce a sliding friction force in a movement process, thereby making the insertion and removal more labor-saving and convenient. In addition, to make the guide grooves 501 play a guiding function, the heat dissipation apparatus is provided with the fastening assemblies, and one end of each connecting member 6 is slidably assembled in a guide groove 501 located on a same side, so that the heat sink 5 can move downward obliquely in the process of insertion or removal, to reduce a sliding friction force in the movement process, thereby making the insertion and removal more labor-saving and convenient. Moreover, as the heat sink 5 moves downward obliquely, the heat sink 5 gradually approaches the surface of the heat source component 1, to make the heat conducting protrusion 502 of the heat sink 5 abut against or be tightly joined to or be in close contact with the surface of the heat source component 1, so that thermal contact resistance between the heat sink and the heat source component can be reduced, thereby improving a heat dissipation capability. That is, in the process of inserting the heat source component 1 into the accommodation portion 301, the heat sink 5 can be driven to move in the length direction, and the heat sink 5 can be driven to move in the thickness direction toward the heat source component 1 under the guiding mating action of one end of the connecting member 6 and the guide groove 501 of the heat sink 5. That is, the heat sink 5 may move in a direction in which the heat conducting protrusion 502 of the heat sink 5 is joined to an upper surface 101 of the heat source component 1 while moving in a direction in which the heat sink 5 moves synchronously with the heat source component 1. Further, the heat conducting protrusion 502 of the heat sink 5 abuts against or is tightly joined to or is in tight contact with the upper surface 101 of the heat source component 1, and no frictional movement occurs between the heat conducting protrusion 502 and the upper surface 101 of the heat source component 1.

In addition, in this process, because the guide groove 501 of the heat sink 5 mates with one end of the connecting member 6, the heat sink 5 applies a specific reaction force to the connecting member 6 during the movement, so that the connecting member 6 also tends to move. In embodiments of this application, the pressing member 7 and the connecting member 6 are disposed in a mating manner, so that the connecting member 6 can be kept from being separated from the bracket assembly 2, or the connecting member 6 can be further enabled to move toward the bracket assembly 2, and a force of the pressing member 7 may also be transmitted to the heat sink 5 through the connecting member 6. In this way, the heat conducting protrusion 502 of the heat sink 5 is tightly joined to the surface of the heat source component 1, thereby providing stable or controllable pressure for the heat conducting protrusion 502 of the heat sink 5 and the surface of the heat source component 1.

Therefore, in the heat dissipation apparatus, through the mating arrangement of the bracket assembly 2, the heat sink 5, the connecting members 6, the pressing members 7, and the like, the heat conducting protrusion 502 of the heat sink 5 can be in tight contact with the surface of the heat source component 1, so that thermal contact resistance of the heat sink 5 and the heat source component 1 is effectively reduced, heat transfer performance between the heat sink 5 and the heat source component 1 is improved, and heat dissipation of the heat source component 1 is more effective. In addition, no sliding friction movement occurs on a heat conducting joining surface between the heat sink 5 and the heat source component 1 in the process of inserting or removing the heat source component 1, the insertion and removal are smooth and labor-saving, and contact pressure is stable and controllable.

It should be noted that, in embodiments of this application, as shown in FIG. 2 and FIG. 3, the heat sink 5 has the first surface, the first surface is a surface of the heat sink 5 relative to the second opening 302, and the first surface may be, for example, a lower surface or a bottom surface of the heat sink 5. That is, the heat conducting protrusion 502 may be located on the lower surface or the bottom surface of the heat sink 5. The heat source component 1 has the upper surface 101. The upper surface 101 may be a surface that faces the first surface of the heat sink 5 when the heat source component 1 is located in the accommodation portion 301. The upper surface 101 is used for being joined to the heat conducting protrusion 502. In addition, the two side surfaces of the heat sink 5 and the heat conducting protrusion 502 are not on the same surface, and the side surface of the heat sink 5 may be a surface at a specific angle or perpendicular to the heat conducting protrusion 502. For example, the two side surfaces of the heat sink 5 may be a front side surface and a rear side surface of the heat sink 5. Alternatively, the two sides of the heat sink 5 may be a left side surface and a right side surface of the heat sink 5.

The components in the heat dissipation apparatus and mating with the heat source component 1 are described in detail below.

[About a Heat Source Component]

Continuing to refer to FIG. 1 to FIG. 3, in some embodiments, the heat source component 1 has the upper surface 101, and the upper surface 101 may be used for contacting the heat conducting protrusion 502 of the heat sink 5. A contact portion 102 is further provided at a side end of the heat source component 1, and the contact portion 102 may be used for mating with a movement driving portion 503 of the heat sink 5, to drive the heat sink 5 and the heat source component 1 to move in the insertion direction synchronously. Specifically, the contact portion 102 may be an end face located at a side end of the heat source component 1 in the insertion direction of the heat source component 1.

Specifically, the heat source component 1 may be a plug-in optical module, and the upper surface 101 of the plug-in optical module may be a surface made of a metal material. It should be understood that there are various types of swappable heat source components, and an application example of an optical module should not be construed as a limitation on embodiments of the present disclosure.

The plug-in optical module may be an existing optical module structure. The upper surface 101 of the optical module generally uses an outer surface made of a metal material. A specific structure and a material of the plug-in optical module are not limited in embodiments of this application.

[About a Bracket Assembly]

Continuing to refer to FIG. 1 to FIG. 3, in some embodiments, the bracket assembly 2 includes a support frame 4 and a cage 3. The support frame 4 is located on an outer side of the cage 3. The accommodation portion 301, the first opening 304, and the second opening 302 are all disposed in the cage 3. The support frame 4 includes two opposite side edges. The heat sink 5 is located between the two side edges. The pressing members 7 are installed on the two side edges.

A connection manner of the support frame 4 and the cage 3 may be two parts of one component, that is, the support frame 4 and the cage 3 are integrally formed, and the two may be of an integrated structure. Alternatively, the support frame 4 and the cage 3 may be of a split structure, and are formed by connecting two independent components. This is not limited in embodiments of the present disclosure.

Specifically, in some embodiments, the support frame 4 and the cage 3 may be integrally formed, that is, the support frame 4 may be used as a part of the cage 3. For example, the support frame 4 may be integrated through mold insert injection molding or the like. In this way, the structural design is simple, the connection is stable and reliable, the integrity of the bracket assembly can be improved, and the overall strength can be improved.

Specifically, in some other embodiments, the support frame 4 and the cage 3 may be fastened, that is, the support frame 4 and the cage 3 may be of a split structure, and the two may be connected together in various connection manners. For example, clamping, a threaded connection, riveting or a screw connection may be used. For example, the support frame 4 may be clamped to the cage 3, or riveted to the cage

3, or sheet metal may be bent and pressed to the cage 3. In this way, separate processing and manufacturing are convenient, which is beneficial to reducing manufacturing difficulty, reliable connection, and convenient operation. It should be understood that a connection manner between the support frame 4 and the cage 3 is not limited in embodiments of this application, and includes but is not limited to the several connection manners listed above, or may be another connection manner such as welding.

Specifically, the cage 3 may be provided with the accommodation portion 301 for accommodating the heat source component 1 and the second opening 302 for the heat conducting protrusion 502 to pass through. Further, the first opening 304 may be provided at a side end of the cage 3, and the heat source component 1 may be inserted into the accommodation portion 301 or removed from the accommodation portion 301 through the first opening 304. The cage 3 may have a top surface 303, and the second opening 302 may be provided in the top surface 303. An opening position and a size of the second opening 302 may be set according to a position of a heating chip of the heat source component 1 or the heat conducting protrusion 502 of the heat sink 5, and a size of the second opening 302 may be smaller than an outline size of the upper surface 101 of the heat source component 1. In this way, a position and a size of the second opening 302 are flexible, so that heat dissipation requirements of different heat source components 1 are satisfied, and the heat dissipation apparatus has good universality. In addition, an extension length of the second opening 302 needs to be at least greater than or equal to the sliding distance of the insertion or removal movement of the heat source component 1.

Specifically, the support frame 4 may be disposed on the outer side of the cage 3. The support frame 4 includes two opposite side edges. An extension direction of the two side edges corresponds to an extension direction of the two side surfaces of the heat sink 5. The heat sink 5 is located between the two side edges. The pressing members 7 in the fastening assemblies may be disposed on two sides, so that it is convenient to insert or remove the heat source component 1 into or from the accommodation portion 301 without affecting the movement of the heat source component 1 or the heat sink 5, it is convenient to arrange the pressing member 7 and the connecting member 6, the structure is compact, and the design is appropriate.

Further, in the support frame 4, two ends of the two side edges may be respectively connected by two connecting plates, and a heat dissipation window 402 may be formed by the two connecting plates and the two side edges. The heat sink 5 is located in the heat dissipation window 402, and may be slidably connected to the heat dissipation window 402. Further, a size of the heat dissipation window 402 may be larger than a size of the second opening 302, or a size of the heat dissipation window 402 may be adapted to a size of the heat sink 5, and a size of the heat dissipation window 402 in the length direction needs to be larger than a size of the heat sink 5 in the length direction, so that the heat sink 5 can slide in the length direction of the heat dissipation window 402.

In this way, the heat sink 5 is installed at the heat dissipation window 402 of the support frame 4, and the heat sink 5 is slidably connected to the heat dissipation window 402. In the process of inserting or removing the heat source component 1, the heat sink 5 can slide in the length direction of the heat dissipation window 402. The heat conducting protrusion 502 of the heat sink 5 passes through the second opening 302 of the cage 3 to be joined to the upper surface 101 of the heat source component 1. The structure is simple, installation and connection are convenient, and heat dissipation of the heat source component 1 is facilitated.

Further, the bracket assembly 2 may be provided with a mating portion 401, and the mating portion 401 may be used for mating with a second connecting portion 602 of the connecting member 6, so that the connecting member 6 can move in a thickness direction relative to the bracket assembly 2. The mating portion 401 and the second connecting portion 602 of the connecting member 6 may be slidably connected, and the mating portion 401 may limit the connecting member 6 to move only in a normal direction of the top surface 303 of the cage 3 and a separation direction of the support frame 4. For example, the mating portion 401 is arranged, so that the connecting member 6 can move only in the thickness direction of the bracket assembly 2, but cannot move in a length direction of the bracket assembly 2. In this way, in the process of inserting or removing the heat source component 1, the heat conducting protrusion 502 of the heat sink 5 abuts against or is closely joined to the upper surface 101 of the heat source component 1, thereby ensuring heat dissipation effect and improving heat conduction efficiency.

Specifically, the mating portion 401 may be disposed on each of the two side edges of the support frame 4. At least one mating portion 401 may be disposed on each of the two side edges of the support frame 4, and arrangement positions and a quantity of the mating portions 401 may be adapted to the positions or quantity of the connecting members 6 or the guide grooves 501 of the heat sink 5.

[About a Heat Sink]

Continuing to refer to FIG. 1 to FIG. 3, FIG. 6, and FIG. 7, in some embodiments, a surface of the heat sink 5 relative to the second opening 302, that is, the first surface of the heat sink 5, is a contact surface with a protrusion, and the protrusion on the contact surface may be the heat conducting protrusion 502. A size of the heat conducting protrusion 502 may be adapted to the size of the second opening 302, so that the heat conducting protrusion 502 passes through the second opening 302 and is joined to the upper surface 101 of the heat source component 1. In addition, the heat conducting protrusion 502 is disposed as a contact surface with a protrusion, which is more beneficial to the contact with the upper surface 101 of the heat source component 1, and helps accelerate dissipation of heat of the heat source component 1, thereby facilitating heat dissipation of the heat source component 1.

It should be noted that, in some other embodiments, the heat conducting protrusion 502 may not be disposed as a contact surface with a protrusion. For example, the bottom surface of the heat sink 5 may be directly used as the heat conducting protrusion 502, which may be adaptively selected and arranged according to the size of the heat sink 5, the size of the second opening 302, and the like in actual application. This is not limited in embodiments of the present disclosure.

In some embodiments, the movement driving portion 503 is further provided on the first surface of the heat sink 5, and the movement driving portion 503 is located on a side of the heat conducting protrusion 502. In the process of inserting the heat source component 1 into the accommodation portion 301, the heat source component 1 gradually moves until the contact portion 102 of the heat source component 1 is connected to the movement driving portion 503, so that the heat sink 5 and the heat source component 1 can be driven to move synchronously in the insertion direction.

In the process of inserting the heat source component 1 into the accommodation portion 301, before the contact portion 102 of the heat source component 1 is connected to the movement driving portion 503, only the heat source component 1 may move and the heat sink 5 does not move. When the heat source component 1 moves to be connected to the movement driving portion 503 on the heat sink 5, through the arrangement of the movement driving portion 503, the heat source component 1 can push the heat sink 5 to move toward the upper surface 101 of the heat source component 1. In this way, movement of the heat sink 5 and the heat source component 1 can be implemented, and the heat conducting protrusion 502 of the heat sink 5 is further joined to the upper surface 101 of the heat source component 1, thereby improving a heat dissipation capability.

Both the heat conducting protrusion 502 and the movement driving portion 503 may be located on the bottom surface of the heat sink 5. The movement driving portion 503 may be located on a side of the heat conducting protrusion 502, and compared with the first opening 304, the heat conducting protrusion 502 may be closer to the first opening 304 than the movement driving portion 503.

The guide grooves 501 are respectively provided in the two side surfaces of the heat sink 5, which can guide the movement of the heat sink 5. Specifically, the heat sink 5 may include heat sink teeth (also referred to as heat sink fins) and a heat sink base. The heat sink teeth and the heat sink base may form the heat sink 5 together. The guide groove 501 may be located on a side wall of the heat sink base, or may be located on a heat sink tooth at an end portion. Specifically, the guide groove 501 may be provided in a side wall of the heat sink base, or provided in a heat sink tooth at an end portion. At least one guide groove 501 is provided in each of the two side walls of the heat sink base or the heat sink teeth at the two end portions.

For example, one or more guide grooves 501 may be provided in each side surface of the heat sink 5. Further, a plurality of guide grooves 501 may be provided in each side surface of the heat sink 5. For example, two, three, four, or more guide grooves 501 may be provided in each side surface of the heat sink 5. In embodiments of the present disclosure, a specific quantity of the guide grooves 501 is not particularly limited, provided that a total quantity of guide grooves is kept an even number. In addition, when a plurality of guide grooves 501 are provided in each side surface of the heat sink 5, an arrangement manner of the guide grooves 501 or a distance between two adjacent guide grooves 501 in one side surface of the heat sink 5 corresponds to an arrangement manner of the guide grooves 501 or a distance between two adjacent guide grooves 501 in the other side surface of the heat sink 5. Correspondingly, a quantity of fastening assemblies corresponds to the quantity of guide grooves. That is, a quantity of connecting members corresponds to the quantity of guide grooves, and a quantity of pressing members corresponds to the quantity of connecting members.

In some embodiments, two guide grooves 501 may be provided in each side surface of the heat sink 5, and the two guide grooves 501 are respectively located at two ends of the side surface. Therefore, the structure is simple, the arrangement is convenient, the stability of movement is improved, and the structure is firmer and more reliable. Correspondingly, two fastening assemblies are disposed on one side surface of the bracket assembly 2, and the two fastening assemblies are arranged corresponding to two guide grooves 501 located on a same side. Two fastening assemblies are arranged on the other side surface of the bracket assembly 2, and the two fastening assemblies are arranged corresponding to two guide grooves 501 located on a same side.

[About a Connecting Member]

Continuing to refer to FIG. 1 to FIG. 3, FIG. 4, and FIG. 5, in some embodiments, the connecting member 6 includes a first connecting portion 601, a second connecting portion 602, and a third connecting portion 603.

One end of the connecting member 6 is the first connecting portion 601, and the first connecting portion 601 is slidably connected to the guide groove 501 of the heat sink 5, so that the heat sink 5 can move obliquely under the guidance of the guide groove 501 in the process of inserting or removing the heat source component 1, so that the heat conducting protrusion 502 is joined to the surface of the heat source component 1.

The other end of the connecting member 6 is the third connecting portion 603, and the third connecting portion 603 is connected to the pressing member 7, and is used for keeping the connecting member 6 from being separated from the bracket assembly 2 in the process of inserting or removing the heat source component 1. For example, when the connecting member 6 moves in the thickness direction of the bracket assembly 2 away from the bracket assembly 2, the pressing member 7 may be used to press the connecting member 6, so that the connecting member 6 moves toward the bracket assembly 2, and an applied force may be transmitted to the heat sink 5, to make the heat conducting protrusion 502 tightly joined to the upper surface 101 of the heat source component 1.

The second connecting portion 602 is disposed between two ends of the connecting member 6, and the second connecting portion 602 is slidably connected to the mating portion 401 of the bracket assembly 2, and is used for limiting the connecting member 6 to only move in the normal direction of the top surface 303 of the cage 3 in the separation direction of the support frame 4 in the process of inserting or removing the heat source component 1. That is, the connecting member 6 can be moved only in the thickness direction of the bracket assembly 2 and not in the length direction of the bracket assembly 2, to keep the connecting member 6 from moving in the insertion direction or the removal direction during the insertion or removal of the heat source component 1 into or from the accommodation portion.

Specifically, the first connecting portion 601 and the third connecting portion 603 are respectively located on two sides of the second connecting portion 602. The first connecting portion 601 is fastened to one end of the second connecting portion 602, and the third connecting portion 603 is fastened to the other end of the second connecting portion 602. Alternatively, the first connecting portion 601, the second connecting portion 602, and the third connecting portion 603 are integrally formed.

It should be understood that in the connecting member 6, the first connecting portion 601, the second connecting portion 602, and the third connecting portion 603 may be of an integrated structure, or may be of a split structure. That is, for a connection manner, the first connecting portion 601, the second connecting portion 602, and the third connecting portion 603 may be three parts of one component, or may be three independent components connected together. This is not limited in embodiments of the present disclosure.

For example, in some embodiments, the first connecting portion 601, the second connecting portion 602, and the third connecting portion 603 are integrally formed. In this way, the structural design is simple, the connection is stable and reliable, and the integrity of the connecting member 6 can be improved. In some other embodiments, one end of the second connecting portion 602 is fastened to the first connecting portion 601, and the other end of the second connecting portion 602 is fastened to the third connecting portion 603. In this way, separate processing and manufacturing are convenient, installation and disassembly are convenient, the connection is reliable, and operations are convenient. The second connecting portion 602 may be fastened to the first connecting portion 601 and the third connecting portion 603 in various manners, for example, welding, clamping, a screw connection, riveting, or screw connection.

[About a Pressing Member]

Continuing to refer to FIG. 1 to FIG. 3, FIG. 8, and FIG. 9, in some embodiments, the pressing member 7 may be installed on the bracket assembly 2, and further, may be installed on an outer side of the support frame 4. Certainly, in another embodiment, an installation position of the pressing member 7 is not limited to the outer side of the support frame 4, and may be installed at a top end of the support frame 4. A specific installation position of the pressing member 7 is not limited in embodiments of this application. At least a part of the pressing member 7 may be pressed above the third connecting portion 603, and the pressing member 7 may press the third connecting portion 603 by applying pressure to the third connecting portion 603. Certainly, in another embodiment, the pressing member 7 may be disposed below the third connecting portion 603, and the pressing member 7 applies a tensile force to the third connecting portion 603, or the third connecting portion 603 may move toward the bracket assembly. In embodiments of this application, a relative position arrangement of the pressing member 7 and the third connecting portion 603 is not limited, provided that the pressing member 7 can apply an acting force to the third connecting portion 603 to limit the connecting member 6 from being separated from the bracket assembly or the acting force is transmitted to the first connecting portion 601 and the heat sink 5 through the third connecting portion 603, so that the heat conducting protrusion 502 is in close contact with the upper surface 101 of the heat source component 1.

Specifically, the pressing member 7 may be disposed on the outer side of the support frame 4. At least one pressing member 7 may be disposed on an outer side wall of the at least one support frame 4, and the arrangement positions and quantity of the pressing members 7 may be adapted to the positions or quantity of the guide grooves 501 of the heat sink 5, the mating portions 401 of the bracket assembly 2, or the connecting members 6.

In some embodiments, the pressing member 7 may be an elastic member, and a material of the pressing member 7 may be an elastic material. The elastic member elastically deforms when the connecting member 6 moves in the thickness direction of the bracket assembly 2 away from the bracket assembly 2 or tends to move in the process of inserting or removing the heat source component 1, and the generated elastic force reacts on the connecting member 6. The connecting member 6 moves toward the bracket assembly 2, and an elastic force is transmitted to the heat sink 5 through the connecting member 6, so that the heat conducting protrusion 502 is tightly joined to the upper surface 101 of the heat source component 1.

Further, to enable the heat source component 1 to be more smoothly removed from the accommodation portion 301, the heat dissipation apparatus may further include a restoring elastic element 8. The restoring elastic element 8 is located between the heat sink 5 and the bracket assembly 2. In the process of removing the heat source component 1 from the accommodation portion 301, the restoring elastic component provides a restoring force, so that the heat conducting protrusion 502 is separated from the heat source component 1.

Specifically, the restoring elastic element 8 may be disposed between a side end of the heat sink 5 and an inner side surface of the support frame 4, to provide the restoring force. In this way, in the process of removing the heat source component 1 from the accommodation portion 301, the restoring elastic element 8 provides the restoring force to release the elastic force of the pressing member 7 to the connecting member 6, and the connecting member 6 can be driven to move toward the bracket assembly 2 in the thickness direction of the bracket assembly 2. Further, the heat conducting protrusion 502 of the heat sink 5 is separated from the upper surface 101 of the heat source component 1.

Specifically, to further improve heat dissipation performance, the heat dissipation apparatus may further include a heat conducting medium 9. The heat conducting medium 9 may be located between the heat conducting protrusion 502 and the heat source component 1.

It can be learned from the foregoing mating arrangement of the bracket assembly 2, the heat sink 5, the connecting member 6, the pressing member 7, and the like that, in the heat dissipation apparatus provided in embodiments of this application, with the use of a movement mechanism, in the process of inserting or removing the heat source component 1 (for example, an optical module), the heat sink 5 and the heat source component 1 move horizontally and synchronously. In other words, no friction occurs between the heat sink 5 and the heat source component 1, which are further pressed vertically, so that flexible contact between the heat sink 5 and the heat source component 1 is implemented. In a process of pressing the optical module, a pressing force at a joint interface between the two can be controlled by the elastic member. Therefore, an objective of reducing the thermal contact resistance between the heat sink 5 and the optical module, implementing smooth insertion and removal of the optical module, and obtaining stable and controllable contact pressure can be achieved. As a board outlet module arrangement develops toward a high density and high bandwidth, the heat dissipation apparatus in embodiments of the present disclosure can satisfy an urgent heat dissipation requirement of an optical module. In addition, the heat dissipation apparatus occupies small space, and the guide groove, the connecting member, the pressing member, and the like are arranged on sides, which can be implemented basically by simply adding interfaces to the existing optical module protocol. The heat dissipation apparatus has high-density panel arrangement, single-layer and multi-layer support, strong adaptability, and good flexibility. The heat dissipation apparatus basically does not change the use habit of a user, and the use of the heat dissipation apparatus is the same as that of a conventional optical module.

Figure 10:
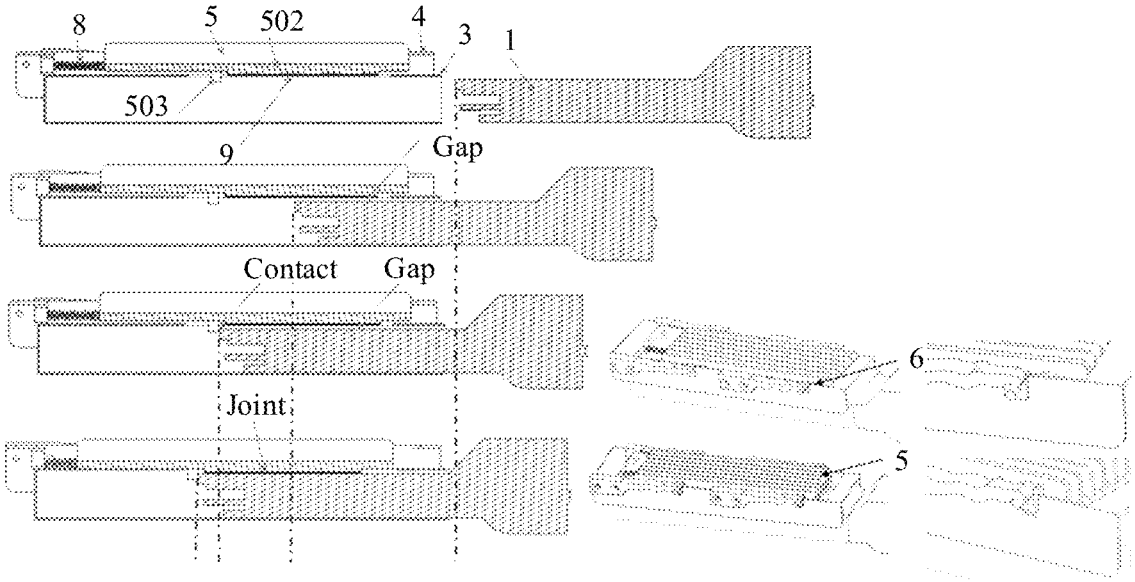
FIG. 10 is a schematic diagram of a process of inserting a heat source component into a heat dissipation apparatus according to an example implementation of this application.

Specifically, for example, the heat source component 1 is an optical module. Referring to FIG. 2, FIG. 3, and FIG. 10, a process of inserting the optical module is as follows: first, the optical module is located outside the cage 3, and is in an initial position of the cage 3. Then, the optical module starts to be inserted into the accommodation portion 301 of the cage 3, and is inserted to a specific distance, and the contact portion 102 at a tail end of the optical module has not yet moved into contact with the movement driving portion 503 of the heat sink 5. There is a specific gap between the heat conducting protrusion 502 of the heat sink 5 and the upper surface 101 of the optical module, and no frictional movement occurs the heat conducting protrusion 502 of the heat sink 5 and the upper surface 101 of the optical module or the heat conducting medium.

Further, the optical module continues to be inserted, and the contact portion 102 at the tail end of the optical module starts to contact the movement driving portion 503 of the heat sink 5. Through the mating between the contact portion 102 and the movement driving portion, the optical module may drive the heat sink 5 to move in the insertion direction. In addition, because the guide groove 501 of the heat sink 5 is connected to the first connecting portion 601 of the connecting member 6, while the heat sink 5 moves synchronously in the insertion direction with the optical module, the heat conducting protrusion 502 of the heat sink 5 may further be joined to the upper surface 101 of the optical module. In other words, the heat sink 5 may move in the length direction and move toward the upper surface 101 of the optical module in the thickness direction, so that the heat conducting protrusion 502 is joined to the upper surface 101 of the optical module, and the heat conducting protrusion 502 and the upper surface 101 of the optical module move without friction. Moreover, in this process, the second connecting portion 602 of the connecting member 6 is connected to the mating portion 401 of the support frame 4, so that the connecting member 6 can only move in the normal direction of the top surface 303 of the cage 3 and the separation direction of the support frame 4. The pressing member 7 is connected to the third connecting portion 603 of the connecting member 6, and may apply specific pressure to the connecting member 6 to keep the connecting member 6 from being separated from the bracket assembly.

Further, after the heat conducting protrusion 502 of the heat sink 5 is in contact with and tightly joined to the upper surface 101 of the optical module, the heat sink 5 stops moving in a direction in which the heat conducting protrusion 502 is joined to the optical module. In this case, the optical module further continues to be inserted, the heat sink 5 continues to move in the insertion direction of the optical module but stops moving in a vertical joining direction. The guide groove 501 of the heat sink 5 jacks up the first connecting portion 601 of the connecting member 6. The connecting member 6 starts to move away from the bracket assembly 2 in the thickness direction of the bracket assembly 2. In this case, the elastic force is provided through elastic deformation of the pressing member 7 pressed above the third connecting portion 603, so that the connecting member 6 can be kept from being separated from the bracket assembly 2, and the connecting member 6 can be pressed tightly until the insertion or removal is completed. It should be understood that the connecting member 6 is in a jacked-up state, and a jacking force may be equal to or close to the pressure of the pressing member 7. The pressure is finally transferred to the heat sink 5, to form a joining force between the heat sink 5 and a contact surface of the optical module.

In this way, through the foregoing heat dissipation apparatus, the thermal contact resistance of the optical module can be reduced by 50% to 80%, the heat dissipation capability can be improved by 5° C. to 10° C., and the insertion and removal are labor-saving.

In addition, the pressing member 7 can provide large joining pressure, the positive pressure is large, and the contact is reliable. A deformation amount of the pressing member 7 that can undergo elastic deformation is designed, a joining force between the heat sink 5 and the optical module can be controlled, and a magnitude of the force can directly affect heat dissipation performance of the optical module.

To make the foregoing restoring elastic element 8 play a role of providing a restoring force in the process of removing the heat source component 1 without hindering the movement of the heat source component 1 in the process of insertion, and to avoid ejecting the heat source component 1 and the heat sink 5 together in the process of insertion, the elastic force or deformation amount of the restoring elastic element 8 needs to be designed. The restoring elastic element 8 is designed according to the mass of the heat sink 5, so that the restoring elastic element 8 does not have the force to eject the heat source component 1 and the heat sink 5, and can only provide the restoring force in the process of removal. Therefore, the heat sink 5 can be driven by the elastic force of the restoring elastic element 8 to be restored.

Further, when the optical module is removed, the restoring elastic element 8 may press an end portion of the heat sink 5, for example, press a return spring contact portion 504 of the heat sink 5, so that the heat sink 5 moves in a removal direction of the optical module. The guide groove 501 of the heat sink 5 is connected to the first connecting portion 601 of the connecting member 6, and the guide groove 501 of the heat sink 5 moves the first connecting portion 601 of the connecting member 6 in an opposite direction of jacking up, that is, the connecting member 6 may move toward the bracket assembly 2 in the thickness direction of the bracket assembly 2. The connecting member 6 is gradually restored from the state of being jacked up, the pressure of joining the heat sink 5 to the optical module is gradually released, finally separation is implemented at a joining position of the heat sink 5 and the optical module, and the heat sink 5 is pushed to an initial position by the restoring elastic element 8.

Therefore, in the heat dissipation apparatus, in the process of inserting or removing the optical module, no sliding friction movement occurs at a heat conducting joining surface between the heat sink 5 and the optical module, and no scratch phenomenon exists, which can alleviate the problem that an existing flexible cushioning heat conducting pad is easily worn, punctured, or wrinkled. Therefore, in the heat dissipation apparatus in embodiments of this application, the heat conducting medium 9 (for example, a flexible heat conducting medium) may be joined to the heat conducting protrusion 502 of the heat sink 5. With the use of the flexible heat conducting medium, thermal contact resistance between the heat sink 5 and the optical module can be reduced, and heat dissipation performance can be improved. In addition, the heat dissipation apparatus is provided with the connecting members 6 and the pressing members 7. In the process of inserting the optical module, the pressing members 7 can always provide stable pressure, that is, a retaining mechanism for a force is provided. The force can be finally applied to the flexible heat conducting medium. There is no concern that the force of the flexible heat conducting medium becomes smaller after long-term creepage, and the thermal conductivity deteriorates, or the heat dissipation capability deteriorates due to the decrease of the joining force.

Based on the foregoing embodiments, further, as shown in FIG. 2 and FIG. 3, the movement driving portion 503 of the heat sink 5 is used for mating with the contact portion 102 of the heat source component 1, and specific structural forms of the movement driving portion 503 and the contact portion 102 may be of various types. Specifically, in some embodiments, the movement driving portion 503 may be a boss disposed on the lower surface (bottom surface) of the heat sink 5, and the contact portion 102 may be at least a part of an end face disposed on a side end of the heat source component 1. The end face on the side end of the heat source component 1 is in contact with the boss on the bottom surface of the heat sink 5, so that the heat sink 5 and the heat source component 1 can be driven to move in the insertion direction together. In this way, the structure is simple, processing and manufacturing are convenient, and the structure of the existing heat source component 1 does not need to be improved.

Further, a distance between the boss and the first surface of the heat sink is greater than a distance between the heat conducting protrusion 502 and the first surface of the heat sink 5. In addition, relative to the first opening, compared with the boss, the heat conducting protrusion 502 may be closer to the first opening 304. A distance between an outer surface of the heat conducting protrusion 502 and the first surface of the heat sink 5 is different from a distance between an outer surface of the boss and the first surface of the heat sink 5. Relatively speaking, the distance between the outer surface of the boss and the first surface of the heat sink 5 is large, so that the contact portion 102 can abut with the boss, and the heat sink 5 can be pushed to move by abutting the contact portion 102 with the boss.

It should be noted that structures of the movement driving portion 503 and the contact portion 102 shown in the accompanying drawings of this application do not constitute a specific limitation on the movement driving portion 503 and the contact portion 102. Embodiments of the present disclosure are mainly described by using an example in which the movement driving portion 503 is a boss, which is not limited in actual application. On the one hand, the structure and shape of the boss are not limited to the structure and shape shown in the accompanying drawings, and on the other hand, the movement driving portion 503 is not limited to a boss, and may be another structure.

For example, in some other embodiments, the movement driving portion 503 may be a hook mating structure, for example, a buckle or a clamp, and the contact portion 102 may be a hook mating with the buckle or the clamp. Through mutual mating between the buckle or the clamp and the hook, the heat sink 5 and the heat source component 1 can be driven to move in the insertion direction together. Certainly, the movement driving portion 503 and the contact portion 102 may be of other shapes and structures that mate with each other, and details are not described herein again.

Figure 4:
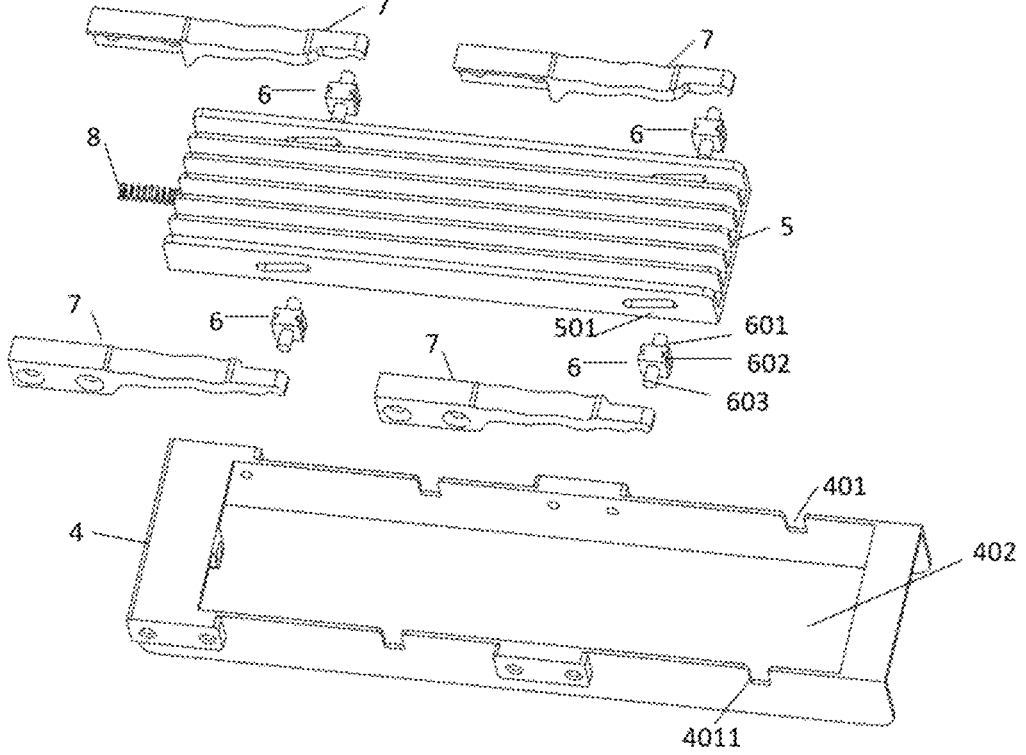
FIG. 4 is an exploded view of a partial structure of a heat dissipation apparatus according to an example implementation of this application.
Figure 5:
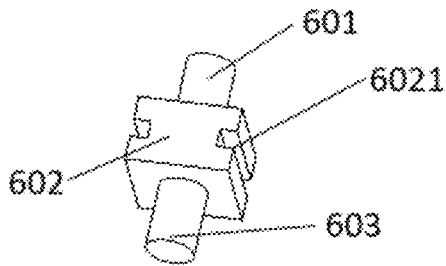
FIG. 5 is a schematic diagram of a structure of a connecting member according to an example implementation of this application.
Figure 6:
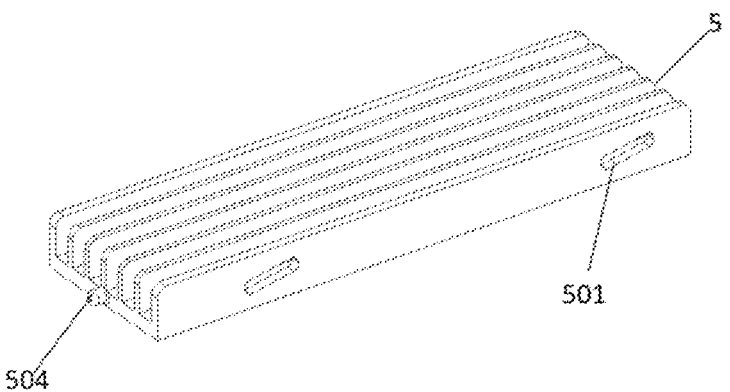
FIG. 6 is a schematic diagram of a structure of a heat sink according to an example implementation of this application.
Figure 7:
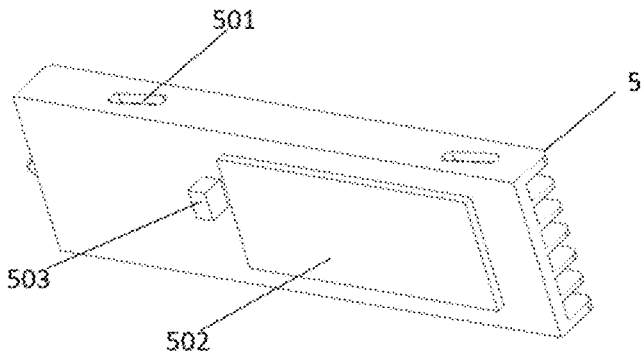
FIG. 7 is a schematic diagram of a structure of another perspective of a heat sink according to an example implementation of this application.
Figure 8:
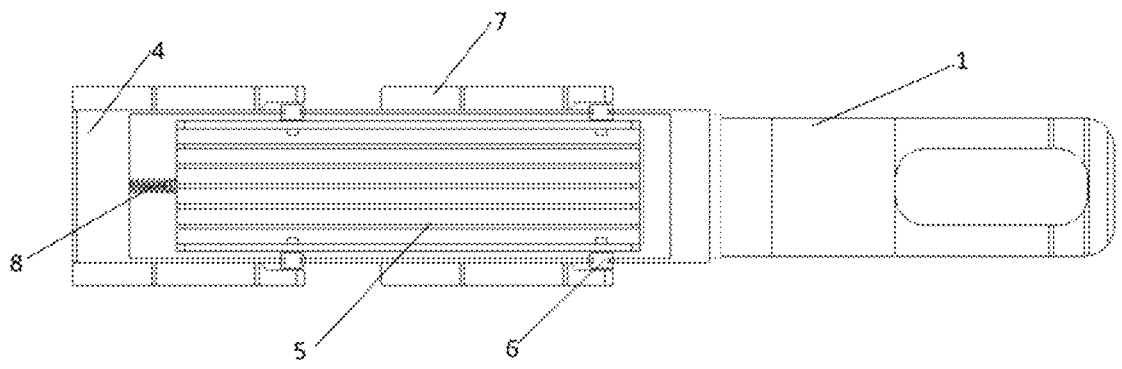
FIG. 8 is a schematic top view of a heat dissipation apparatus according to an example implementation of this application.
Figure 9:
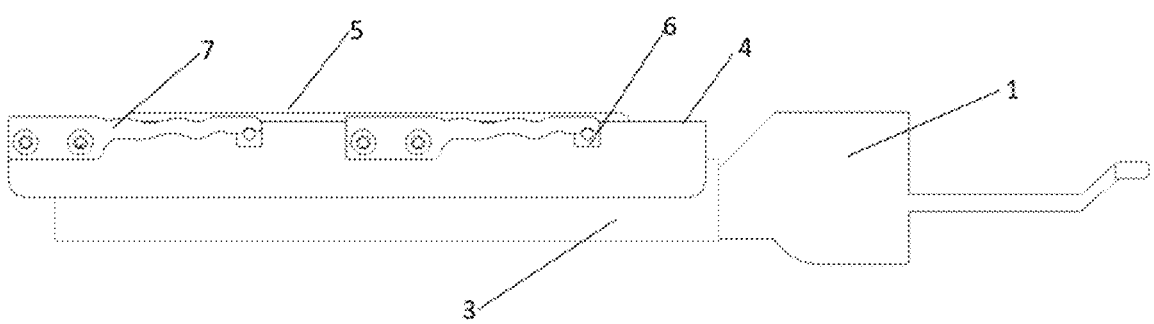
FIG. 9 is a schematic front view of a heat dissipation apparatus according to an example implementation of this application.

Based on the foregoing embodiments, further, as shown in FIG. 2 to FIG. 4, to implement effective contact between the heat conducting protrusion 502 and the upper surface 101 of the heat source component 1, reduce thermal contact resistance, and improve heat conduction efficiency, specific structural forms of the guide groove 501 provided in the side surface of the heat sink 5 may be of various types. Specifically, in some embodiments, the guide groove 501 includes a linear guide groove or an arc-shaped guide groove. That is, a cross section of the guide groove 501 may be a guide slope or a guide arc surface. The guide groove 501 may be arranged as a linear guide groove that is gradually inclined, or may be arranged as an arc-shaped guide groove with a specific radian, provided that the heights of the two end portions of the guide groove 501 are different, and the heat conducting protrusion 502 of the heat sink 5 can finally move in the direction of being joined to the upper surface 101 of the heat source component 1.

Specifically, the guide groove 501 has a first end and a second end, and the first end and the second end have different heights. Further, the guide groove 501 is a linear guide groove, and is gradually inclined downward from the first end to the second end in the insertion direction of the heat source component 1, so that the heat sink 5 can move obliquely downward, to make the heat conducting protrusion 502 abut against the upper surface 101 of the heat source component 1. In this way, the structure is simple, movement of the heat sink 5 is convenient, and a problem that the swappable structure and the heat sink 5 have increased thermal resistance and low heat conduction efficiency due to gaps that exist between the surface of the heat source component 1 of the existing swappable structure and the heat conducting protrusion 502 of the heat sink 5 can be alleviated.

The first connecting portion 601 is used for mating with the guide groove 501, and may form an inclined movement to guide the movement of the heat sink 5. The shape and structure of the first connecting portion 601 may be of various types, and may be of a cylindrical shape shown in the accompanying drawings, or certainly may be of another structural form. This is not limited in this application.

It should be noted that the structures of the guide groove 501 and the first connecting portion 601 shown in the accompanying drawings of this application do not constitute a specific limitation on the guide groove 501 and the first connecting portion 601, which may alternatively be of other structures or forms that can form a movement in an inclined direction. In embodiments of the present disclosure, the linear guide groove 501 and the columnar first connecting portion 601 are mainly used as examples for description, and the actual application is not limited thereto. For example, a manner such as a sliding block boss, a groove, and a guide rail may be used. Details are not described herein again.

Based on the foregoing embodiments, further, as shown in FIG. 2 to FIG. 5, to enable the connecting member 6 to move only in the thickness direction of the bracket assembly 2 and keep the connecting member 6 from moving in the insertion direction or the removal direction when the heat source component 1 is inserted into or removed from the accommodation portion 301, the bracket assembly 2 is provided with the mating portion 401 that mates with the second connecting portion 602.

The shape and structure or mating manner of the mating portion 401 and the second connecting portion 602 may also be of various types, and a common mechanism that can move linearly may be used, for example, a mechanism that can only move up and down linearly and is limited from moving left and right is used. For example, the second connecting portion and the mating portion may be in a form of a concave-convex mating structure, or may be in a form of a mating structure of a guide pin and a guide sleeve, or may be in a form of a mating structure of a slider and a guide rail, or the like.

Specifically, in some embodiments, the second connecting portion 602 is of a block structure. The block structure is provided with a concave groove 6021. The mating portion 401 is provided with a limiting protrusion 4011. The concave groove 6021 is connected to the limiting protrusion 4011 in a concave-convex mating manner. The second connecting portion 602 can move in the thickness direction of the bracket assembly 2, for example, up and down, thereby driving the connecting member 6 to move up and down, and limit the connecting member 6 to move in the insertion direction. Alternatively, in another embodiment, a limiting protrusion may be disposed in the block structure, and a concave groove may be provided in the mating portion 401.

Therefore, the second connecting portion 602 and the mating portion 401 form a mechanism that can move up and down linearly, which is simple in structure, convenient in processing and manufacturing, and can further limit the movement of the connecting member 6 in the insertion direction in the process of inserting or removing the heat source component 1.

In some other embodiments, the second connecting portion 602 and the mating portion 401 may be a guide pin and a guide sleeve that mate with each other. For example, the second connecting portion 602 may be provided with the guide pin structure, and the mating portion 401 may be provided with the guide sleeve structure. The guide pin can be inserted into the guide sleeve to move linearly up and down, and the connecting member 6 can be limited to move in the insertion direction. Alternatively, in another embodiment, the second connecting portion may be provided with a guide sleeve structure, and the mating portion may be provided with a guide pin structure.

It may be understood that a specific structure and a mating manner of the second connecting portion 602 and the mating portion 401 that are shown in the accompanying drawings of this application do not constitute a specific limitation on the second connecting portion 602 and the mating portion 401. Embodiments of the present disclosure are mainly described by using an example in which the second connecting portion 602 is provided with the concave groove 6021, and the mating portion 401 is provided with the limiting protrusion 4011, which is not limited in actual application.

Based on the foregoing embodiments, further, as shown in FIG. 2 to FIG. 5, to limit the connecting member 6 from being separated from the bracket assembly 2 and further provide a specific elastic force or a pressing force for the connecting member 6 in the process of insertion or removal, the pressing member 7 may be disposed above the third connecting portion 603, and a specific form or connection arrangement of the third connecting portion 603 and the pressing member 7 may be of various types. Specifically, in some embodiments, the pressing member 7 is installed on an outer side of the bracket assembly 2, and the pressing member 7 is at least partially pressed above the third connecting portion 603. The third connecting portion 603 may be of a columnar structure, for example, may be a cylinder, a square columnar body, or an irregular columnar body.

It should be noted that structures of the pressing member 7 and the third connecting portion 603 that are shown in the accompanying drawings of this application do not constitute a specific limitation on the pressing member 7 and the third connecting portion 603, which may alternatively be of other structures or forms that can form an elastic member that applies a force. Embodiments of the present disclosure are mainly described by using the cantilever elastic member and the cylindrical third connecting portion 603 as an example, and the actual application is not limited thereto. For example, the pressing member 7 and the third connecting portion 603 may be of other structural forms.

It may be understood that, the heat dissipation apparatus is provided with the pressing member 7, so that the contact pressure between the heat source component 1 and the heat sink 5 can be stable and controllable. In particular, in the process of inserting or removing the heat source component 1, the heat sink 5 jacks up the connecting member 6. In a jacking process, the heat sink 5 needs to overcome the pre-pressure of the pressing member 7, which is the minimum force for pressing the heat source component 1 and the heat sink 5. Through such control, the heat source component 1 and the heat sink 5 can maintain controllable pressure.

Specifically, in some embodiments, the pressing member 7 may be an elastic member. The elastic member may be a spring sheet. The spring sheet may be a cantilever spring sheet or a two-end fixed spring sheet. It may be understood that the cantilever spring sheet is a cantilever spring sheet in operation. One end of the cantilever spring sheet may be fixed, and the other end may not be fixed.

Further, one end of the cantilever spring sheet may be fastened to the outer side wall of the support frame 4, for example, may be connected by a screw or the like. The other end of the cantilever spring sheet may be a free end, and the free end may be pressed above the third connecting portion 603 of the connecting member 6.

Further, two ends of the two-end fixed spring sheet may be respectively fastened to the outer side wall of the support frame 4, for example, may be connected by screws or the like, and part of the spring sheet located between two ends of the two-end fixed spring sheet may be pressed above the connecting member 6.

The spring sheet may be a cantilever spring sheet as shown in the accompanying drawings, or may be a spring sheet with two ends restrained and the middle receiving a force. The spring sheet may be a sheet metal spring sheet, for example, a sheet metal cantilever spring sheet structure. Alternatively, a spring sheet of another structural form may be used. A structure or an installation manner of the spring sheet is not limited in embodiments of the present disclosure.

In some other embodiments, the pressing member 7 may be an elastic member. The elastic member may be a spring. The spring may be a cantilever spring or two-end fixed spring sheet. It may be understood that the cantilever spring is a cantilever spring in operation. One end of the cantilever spring may be fixed, and the other end may not be fixed.

Further, one end of the cantilever spring may be fastened to the outer side wall of the support frame 4, for example, may be connected by a screw or the like. The other end of the cantilever spring may be a free end, and the free end may be pressed above the third connecting portion 603 of the connecting member 6.

Further, two ends of the two-end fixed spring may be respectively fastened to the outer side wall of the support frame 4, for example, may be connected by screws or the like, and part of the spring located between two ends of the two-end fixed spring may be pressed above the connecting member 6.

The spring may be a cantilever spring or a spring with two ends restrained and the middle receiving a force. The spring may be a cylindrical spring, a wire spring, a torsion spring, a leaf spring, a multi-fulcrum compression spring, or any other spring that forms a compressive force through deformation. A structure or an installation manner of the spring is not limited in embodiments of the present disclosure.

Based on the foregoing embodiments, further, to provide a specific restoring force in the process of removing the heat source component 1 from the accommodation portion 301 to facilitate separation of the heat conducting protrusion 502 of the heat sink 5 from the heat source component 1, the restoring elastic element 8 is disposed between the heat sink 5 and the bracket assembly 2. Specific structural forms or connection arrangement of the restoring elastic element 8 may also be of a plurality of types. Specifically, in some embodiments, one end of the restoring elastic element 8 is connected to an inner side surface of the bracket assembly 2, and the other end of the restoring elastic element 8 is connected to an outer side end of the heat sink 5. Further, one end of the restoring elastic element 8 is connected to the inner side surface of the support frame 4, and the other end of the restoring elastic element 8 may be connected to the return spring contact portion 504 of the heat sink 5.

In some other embodiments, one end of the restoring elastic element 8 may be connected to the inner side surface of the bracket assembly 2, and the other end of the restoring elastic element 8 abuts against the outer side end of the heat sink 5. Alternatively, one end of the restoring elastic element 8 may abut against the inner side surface of the bracket assembly 2, and the other end of the restoring elastic element 8 is connected to the outer side end of the heat sink 5.

A connection manner of the restoring elastic element 8 to the bracket assembly 2 or the heat sink 5 may be of a plurality of types, for example, a manner commonly used in this field, such as screwing, clamping, and welding, which is not limited in embodiments of the present disclosure, and is not described in detail herein.

In embodiments of the present disclosure, similar to the pressing member 7, the restoring elastic element 8 may also be an elastic member, and the elastic member may be a spring or a spring sheet. For example, the restoring elastic element 8 may be a cylindrical compression spring shown in the accompanying drawings, or may be any other spring that forms a compressive force by deformation, such as a cylindrical spring, a wire spring, a torsion spring, a leaf spring, a cantilever spring sheet or a sheet metal spring sheet structure. Similarly, the restoring elastic element 8 may be of a cantilever structure, or may be of a two-end fixed structure, that is, the spring or the spring sheet may be a cantilever spring or spring sheet, or may be a spring or spring sheet with two ends restrained and the middle receiving a force. A specific structure or installation manner of the restoring elastic element 8 is not limited in embodiments of the present disclosure, and details are not described herein again.

Based on the foregoing embodiments, further, to further improve heat dissipation effect and heat dissipation efficiency, the heat conducting medium 9 may be disposed in the heat dissipation apparatus. Specifically, in some embodiments, the heat dissipation apparatus further includes the heat conducting medium 9. The heat conducting medium 9 is located between the heat conducting protrusion 502 and the heat source component 1. In this way, the heat conducting medium 9 is added, so that the thermal contact resistance is reduced, thereby improving the heat dissipation effect.

A flexible heat conducting medium commonly used in this field may be used as the heat conducting medium 9, and a specific material, structure, or connection of the heat conducting medium 9 is not limited in embodiments of the present disclosure.

For example, a heat conducting pad made of a single-sided adhesive thermally conductive material may be used. A sticky side is joined to the heat conducting protrusion 502, or may be joined to the upper surface 101 of the heat source component 1.

Specifically, the heat conducting medium 9 is connected to the heat conducting protrusion 502, or the heat conducting medium 9 is connected to the upper surface 101 of the heat source component 1.

It should be noted that the foregoing heat conducting medium 9 is optional. The heat conducting medium 9 may be disposed in the heat dissipation apparatus, or the heat conducting medium 9 may not be disposed in the heat dissipation apparatus, which may be selected and arranged according to an actual requirement in actual application.

It should be noted that, the term "and/or" in this specification describes only an association relationship for describing associated objects and represents that three relationships may exist. For example, A and/or B may represent the following three cases: Only A exists, both A and B exist, and only B exists. The terms "a", "said" and "the" of singular forms used in embodiments and the appended claims of this application are also intended to include plural forms, unless otherwise specified in the context clearly.

In the description of this application, unless otherwise explicitly specified and limited, the terms "first", "second", and "third" are used only for description purposes, and cannot be understood as indicating or implying relative importance. Unless otherwise specified or indicated, the term "a plurality of" means two or more. The terms "connection", "fixed", and the like should be understood in a broad sense. For example, "connection" may be a fixed connection, a detachable connection, an integral connection, or an electrical connection; may be a direct connection or an indirect connection through an intermediate medium. A person of ordinary skill in the art may understand specific meanings of the foregoing terms in this application according to specific cases.

In the description of this application, it should be understood that an orientation or a position relationship indicated by the terms "upper", "lower", "front", "rear", "left", "right", "top", "bottom", "inside", "outside", or the like is an orientation or position relationship shown in the accompanying drawings, and is merely intended to facilitate description and simplify description of this application, but is not intended to indicate or imply that a specified apparatus or element needs to have a specific orientation, be constructed in a specific orientation, and operate in a specific orientation. Therefore, this application cannot be construed as a limitation. In addition, in this context, it is also to be understood that when reference is made to one element being connected "up" or "down" to another element, it cannot only be directly connected "up" or "down" to the other element, but also can be indirectly connected "up" or "down" to another element by an intermediate element.

What is claimed is:

1. A heat dissipation apparatus, comprising:
a bracket assembly comprising
an accommodation portion for accommodating a heat source component,
a first opening provided at an end of the accommodation portion for inserting or removing the heat source component, and
a second opening provided-above the accommodation portion;
a heat sink, wherein a heat conducting protrusion is disposed on a first surface of the heat sink and extends into the accommodation portion through the second opening; wherein the first surface is provided with a movement driving portion located on a side of the heat conducting protrusion; wherein, in a process of inserting the heat source component into the accommodation portion, after the heat source component is in contact with the movement driving portion, the heat source component pushes the heat sink to move in an insertion direction, and wherein guide grooves are respectively provided in two side surfaces of the heat sink, wherein an extension direction of the guide grooves is inclined toward the first surface in the insertion direction of the heat source component; and fastening assemblies mating with the bracket assembly, so that in the process of inserting the heat source component into the accommodation portion, after the heat source component is in contact with the movement driving portion, the heat sink moves toward a surface of the heat source component; wherein the fastening assemblies provide pressure for the heat conducting protrusion to be joined to the surface of the heat source component.

2. The heat dissipation apparatus according to claim 1, wherein the movement driving portion is a boss, wherein a distance between the boss and the first surface of the heat sink is greater than a distance between the heat conducting protrusion and the first surface of the heat sink; and wherein a contact portion is disposed at a side end of the heat source component in the insertion direction of the heat source component and abuts against the boss.

3. The heat dissipation apparatus according to claim 1, wherein each fastening assembly comprises a connecting member and a pressing member, wherein the pressing members are disposed on two sides of the bracket assembly, wherein, for each fastening assembly, a first connecting portion of a connecting member is slidably assembled in a guide groove of the guide grooves located on a same side, and a third connecting portion of the connecting member abuts against a pressing member located on a same side, and wherein in the process of inserting the heat source component into the accommodation portion, after the heat source component is in contact with the movement driving portion, the first connecting portion of the connecting member slides toward the first opening in the guide groove, to drive the heat sink to move toward the surface of the heat source component, and the pressing member provides, by the connecting member, pressure for the heat conducting protrusion to be joined to the surface of the heat source component.

4. The heat dissipation apparatus according to claim 3, wherein the connecting member is fastened to the pressing member; or
the connecting member and the pressing member are integrally formed.

5. The heat dissipation apparatus according to claim 3, wherein the bracket assembly comprises a support frame and a cage, wherein the support frame is located outside the cage, wherein the accommodation portion, the first opening, and the second opening are all disposed in the cage; wherein the support frame comprises two opposite side edges, wherein the heat sink is located between the two opposite side edges of the support frame, and wherein the pressing members are installed on the two opposite side edges of the support frame.

6. The heat dissipation apparatus according to claim 5, wherein the support frame is fastened to the cage; or
the support frame and the cage are integrally formed.

7. The heat dissipation apparatus according to claim 5, wherein mating portions are respectively disposed on two side edges of the support frame, the connecting member comprises a second connecting portion connected to a mating portion of the mating portions, and the second connecting portion is located between the first connecting portion and the third connecting portion of the connecting member; and the connecting member mates with the mating portion to limit a movement direction of the connecting member.

8. The heat dissipation apparatus according to claim 7, wherein the second connecting portion is of a block structure, and a concave groove and a limiting protrusion that mate with each other are respectively disposed on a surface of the block structure and a surface of the mating portion, wherein the surface of the block structure and the surface of the mating portion are in contact.

9. The heat dissipation apparatus according to claim 7, wherein a guide pin and a guide sleeve that mate with each other are respectively disposed on a surface of the second connecting portion and a surface of the mating portion, wherein the surface of the second connecting portion and the surface of the mating portion are in contact.

10. The heat dissipation apparatus according to claim 3, wherein the pressing member is an elastic member.

11. The heat dissipation apparatus according to claim 10, wherein a first end of the elastic member is fastened to the bracket assembly, a second end of the elastic member is a free end abutting against the connecting member; or the first end and the second end of the elastic member are fastened to the bracket assembly, and the connecting member abuts against the first end and the second end of the elastic member.

12. The heat dissipation apparatus according to claim 1, wherein the heat dissipation apparatus further comprises a restoring elastic element, a first end of the restoring elastic element is connected to the heat sink, and a second end of the restoring elastic element is connected to the bracket assembly; and the restoring elastic component provides a restoring force, so that the heat conducting protrusion is separated from the heat source component in a process of removing the heat source component from the accommodation portion.

13. The heat dissipation apparatus according to claim 1, wherein the heat dissipation apparatus further comprises a heat conducting medium; and the heat conducting medium is connected to the heat conducting protrusion, or the heat conducting medium is connected to the surface of the heat source component.

14. An electronic device, comprising a heat source component, wherein the electronic device further comprises a heat dissipation apparatus, the heat dissipation apparatus comprising:

a bracket assembly comprising
an accommodation portion for accommodating a heat source component,
a first opening provided at an end of the accommodation portion for inserting or removing the heat source component, and
a second opening provided above the accommodation portion;

a heat sink, wherein a heat conducting protrusion is disposed on a first surface of the heat sink and extends into the accommodation portion through the second opening; wherein the first surface is provided with a movement driving portion located on a side of the heat conducting protrusion; wherein, in a process of inserting the heat source component into the accommodation portion, after the heat source component is in contact with the movement driving portion, the heat source component pushes the heat sink to move in an insertion direction, and wherein guide grooves are respectively provided in two side surfaces of the heat sink, wherein an extension direction of the guide grooves is inclined toward the first surface in the insertion direction of the heat source component; and fastening assemblies mating with the bracket assembly, so that in the process of inserting the heat source component into the accommodation portion, after the heat source component is in contact with the movement driving portion, the heat sink moves toward a surface of the heat source component; wherein the fastening assemblies provide pressure for the heat conducting protrusion to be joined to the surface of the heat source component.

15. The electronic device according to claim 14, wherein the movement driving portion is a boss, and wherein a distance between the boss and the first surface of the heat sink is greater than a distance between the heat conducting protrusion and the first surface of the heat sink; and wherein a contact portion is disposed at a side end of the heat source component in the insertion direction of the heat source component and abuts against the boss.

16. The electronic device according to claim 14, wherein each fastening assembly comprises a connecting member and a pressing member, wherein the pressing members are disposed on two sides of the bracket assembly, wherein, for each fastening assembly, a first connecting portion of a connecting member is slidably assembled in a guide groove located on a same side, and a third connecting portion of the connecting member abuts against a pressing member located on a same side, wherein, in the process of inserting the heat source component into the accommodation portion, after the heat source component is in contact with the movement driving portion, the first connecting portion of the connecting member slides toward the first opening in the guide groove, to drive the heat sink to move toward the surface of the heat source component, and the pressing member provides, by the connecting member, pressure for the heat conducting protrusion to be joined to the surface of the heat source component.

17. The electronic device according to claim 16, wherein the connecting member is fastened to the pressing member; or the connecting member and the pressing member are integrally formed.

18. The electronic device according to claim 16, wherein the bracket assembly comprises a support frame and a cage, wherein the support frame is located outside the cage, wherein the accommodation portion, the first opening, and the second opening are all disposed in the cage; and wherein the support frame comprises two opposite side edges, wherein the heat sink is located between the two side edges of the support frame, and wherein the pressing members are installed on the two side edges of the support frame.

19. The electronic device according to claim 18, wherein the support frame is fastened to the cage; or the support frame and the cage are integrally formed.

20. The electronic device according to claim 18, wherein mating portions are respectively disposed on two side edges of the support frame, the connecting member comprises a second connecting portion connected to a mating portion of the mating portion, and the second connecting portion is located between the first connecting portion and the third connecting portion of the connecting member; and the connecting member mates with the mating portion to limit a movement direction of the connecting member.

* * * * *